(12) United States Patent
Umezu et al.

(10) Patent No.: US 7,035,959 B2
(45) Date of Patent: Apr. 25, 2006

(54) ADAPTER FOR CONTROLLING A MEASURING DEVICE, A MEASURING DEVICE, A CONTROLLER FOR A MEASURING DEVICE, A METHOD FOR PROCESSING MEASUREMENT AND A RECORDING MEDIUM

(75) Inventors: Satoshi Umezu, Tokyo (JP); Jun Miyajima, Tokyo (JP); Takahiro Yamaguchi, Tokyo (JP); Norio Arakawa, Tokyo (JP)

(73) Assignee: Advantest Corporation, (JP)

( * ) Notice: Subject to any disclaimer, the term of this patent is extended or adjusted under 35 U.S.C. 154(b) by 557 days.

(21) Appl. No.: 09/835,824

(22) Filed: Apr. 17, 2001

(65) Prior Publication Data

US 2002/0013835 A1    Jan. 31, 2002

Related U.S. Application Data

(63) Continuation of application No. PCT/JP00/05452, filed on Aug. 14, 2000.

(30) Foreign Application Priority Data

Aug. 17, 1999  (JP)  ................................. 11-230598
Aug. 26, 1999  (JP)  ................................. 11-239991

(51) Int. Cl.
  *G06F 13/36*  (2006.01)
(52) U.S. Cl. ............................. 710/315; 710/2; 710/5; 710/23; 710/32; 710/106; 709/212; 709/218; 709/250; 709/253; 702/80; 702/188; 702/189; 700/117
(58) Field of Classification Search ................ 702/176, 702/127, 188; 700/160, 121
See application file for complete search history.

(56) References Cited

U.S. PATENT DOCUMENTS

| 4,878,179 | A | * | 10/1989 | Larsen et al. ................... 716/4 |
| 5,790,977 | A |   | 8/1998  | Ezekiel ....................... 702/122 |
| 5,903,724 | A | * | 5/1999  | Takamoto et al. .......... 709/200 |
| 6,052,653 | A | * | 4/2000  | Mazur et al. ................. 702/57 |

(Continued)

FOREIGN PATENT DOCUMENTS

JP  H10-241089  9/1998

OTHER PUBLICATIONS

V. R. Born et al., "Diverse setups controlled by one graphical user interface", 11th IEEE NPSS Real Time Conference, Santa F Jun. 14-18, 1999, pp. 271-272.*

(Continued)

*Primary Examiner*—Anthony Knight
*Assistant Examiner*—Crystal J Barnes
(74) *Attorney, Agent, or Firm*—Osha Liang LLP

(57) ABSTRACT

A measuring device, a measuring device controller, a measuring system, a measurement process performing method and a recording medium thereof which can easily and adequately perform a measurement process are provided. The present invention is constructed to include a program receiving unit 110 for receiving a control program, which comprises contents prescribing a measurement process, from said network; a memorizing unit 120 for memorizing the control program; an initiating instruction receiving unit 130 for receiving a program initiating instruction of the control program from the network; and a measurement control unit 156 for letting a measuring unit 160 perform the measurement process based on the control program memorized by the memorizing unit 120 in case the initiating instruction receiving unit 130 receives the program initiating instruction.

35 Claims, 18 Drawing Sheets

U.S. PATENT DOCUMENTS

| | | | |
|---|---|---|---|
| 6,105,093 A * | 8/2000 | Rosner et al. | 710/105 |
| 6,233,534 B1 * | 5/2001 | Morozumi et al. | 702/176 |
| 6,338,030 B1 * | 1/2002 | Senn et al. | 702/189 |
| 6,363,294 B1 * | 3/2002 | Coronel et al. | 700/121 |
| 6,937,844 B1 * | 8/2005 | Malmstrom et al. | 455/41.2 |
| 2002/0083128 A1 * | 6/2002 | Miyajima et al. | 709/203 |
| 2005/0138234 A1 * | 6/2005 | Ali Khan et al. | 710/24 |
| 2005/0240373 A1 * | 10/2005 | Wubbena et al. | 702/122 |
| 2005/0251564 A1 * | 11/2005 | Tillotson et al. | 709/218 |

OTHER PUBLICATIONS

C. Perello et al., "An open system to interface IEEE-488 measurement devices designed in a microelectronics environment", IMTC, 'Quality Measurements: The Indispensable Bridge between Theory and Reality', vol.: 1, 1996, pp.: 192-195.*

* cited by examiner

```
0:  try{
1:      GENERATE COMPOSITE MEASUREMENT TASK
2:      GENERATE O B W MEASUREMENT TASK
3:      SETUP MEASUREMENT PARAMETER ON OBW MEASUREMENT TASK
4:      GENERATE A C P MEASUREMENT TASK
5:      SETUP MEASUREMENT PARAMETER ON A C P MEASUREMENT TASK
6:      ADD O B W MEASUREMENT TASK TO RETAINING RELATION OF COMPOSITE MEASUREMENT TASK
7:      ADD A C P MEASUREMENT TASK TO RETAINING RELATION OF COMPOSITE MEASUREMENT TASK
8:  }
9:  catch(STORE TASK EXCEPTION INFORMATION TO VARIABLE E) {
10:     TASK EXCEPTION HANDING
11: }
```

*FIG. 6*

```
                            public class program
                            {
                              OBWmeasurement obw;
                              ACPmeasurement acp;
                              dataTransportation dt;
                              program()
                              {
P1: GENERATE OBW MEASUREMENT ──▶ obw = new OBWmeasurement();
    OBJECT
P2: GENERATE ACP MEASUREMENT ──▶ acp = new ACPmeasurement();
    OBJECT
        P3: GENERATE           ──▶ dt = new dataTransportation();
            MEASUREMENT DATA
            TRANSFER OBJECT      ⎛ obw.setCenter(918573500);
                                 ⎜ obw.setSpan(4000000);
        P4: PARAMETER SETUP ──▶ ⎨ obw.setBandRatio(99);
                                 ⎜ acp.setChannelBandWidth(1250000);
                                 ⎝ acp.setChannelSpacing(1250000);
                              }

P5: PROCESS TO BE PERFORMED ──▶ public boolean execute()
                              {
                                obw.startMeasurement();
                                acp.startMeasuremnet();
                                ⎛ dt.transport(obw.getData());
P6: TRANSFER MEASUREMENT  ──▶ ⎨ dt.transport(acp.getData());
    DATA OBJECT               ⎝ return True;
                              }
                              public static void main(strinf args[])
                              {
                                program meas = new program();
                                meas.execute();
                              }
                            }
```

FIG. 15

ADAPTER FOR CONTROLLING A
MEASURING DEVICE, A MEASURING
DEVICE, A CONTROLLER FOR A
MEASURING DEVICE, A METHOD FOR
PROCESSING MEASUREMENT AND A
RECORDING MEDIUM

This is a continuation application of PCT/JP00/05452 filed on Aug. 14, 2000, the contents of which are incorporated herein by reference.

BACKGROUND OF THE INVENTION

1. Field of the Invention

The present invention relates to an adapter for controlling a measuring device, a measuring device, a controller for a measuring device, a method for processing measurement and a recording medium.

2. Description of the Related Art

It is conventional to use measuring devices for objects to be measured in order to perform production assessment, quality control, repair, correction, alignment, adjustment, performance evaluation, diagnosis, import inspection, etc. One example of conventional technologies for controlling measuring devices is to couple a measuring device to a computer through GPIB (General Purpose Interface bus, IEEE488). The measuring device is controlled according to commands transferred from the computer through GPIB. In the above case of controlling a measuring device by a computer through GPIB, a GPIB communication card dedicated for measuring device control is required.

Another example of conventional technology is to use a measuring device capable of running a control program coded in a programming language, such as BASIC. The control program on a floppy diskette is input to the measuring device, and it runs the control program for performing measurement process. According to a Japanese patent application (Laid-Open Serial No. 1998-241089(U.S. Pat. No. 05,790,977)), a measuring device stores software for control of the measuring device and data acquisition from the measuring device. The software is loaded on a remote host system, and the remote host system runs the software to control the measuring device.

Recently, computer networks, for example Ethernet, have developed drastically, so that communication speed has increased and communication costs have decreased. Therefore, in order to connect a measuring device to a computer through Ethernet, a measuring device equipped with an Ethernet port as one of standardized parts is disclosed.

Further, in order to control a measuring device through Ethernet, an Ether-GPIB converter is used to mediate GPIB and Ethernet. In this case, a computer sends control commands to an Ether-GPIB converter, and the Ether-GPIB converter sends received control commands to the measuring device through GPIB. The Ether-GPIB converter sends measuring data from the measuring device through Ethernet.

However, according to the conventional system where the measuring device and the computer is connected through GPIB, since control commands must be transferred through GPIB for every operation of a parameter setup or measurement, the communication time becomes very long. Further, it is impossible to construct the control program run by the computer without detailed knowledge of the measuring device.

According to the conventional measuring device which performs a measuring process by running a control program, control commands can be transferred through a bus of the measuring device so that the communication time can be reduced. However, constructions to display the measured results are not facilitated. Further, it is also impossible to construct the control program run by the computer without detailed knowledge of the measuring device.

In case the Internet or an Intranet is used as the Ethernet, since communication packets other than communication commands are present, the time when control commands from the computer arrive at the Ether-GPIB converter is indefinite. Therefore, the measuring device is not to be properly controlled. In addition, the time when measured data transferred by the measuring device arrives at the computer from the Ether-GPIB converter is also indefinite. Further, since Ethernet is designed for transferring packet data of, for example about 1000 bytes, when a plurality of data consisting of dozens of bytes are transferred, it is possible to occur overhead and, in the worst case, the measuring device can become uncontrollable.

SUMMARY OF THE INVENTION

Therefore, it is the object of the present invention to provide an adapter for controlling a measuring device, a measuring device, a controller for a measuring device, a method for performing a measurement process and a recording medium which can solve the above and other problems of the conventional technology. The object of the present invention can be achieved by the characteristic features of the independent claims. Dependent claims of the present invention define useful variations of concrete embodiments of the present invention.

According to the first embodiment of the present invention, there is provided a measuring device controlling adapter coupled to a first network and to a measuring unit for performing a measurement process including: a program receiving unit for receiving a control program for performing the measurement process from the first network; a memorizing unit for memorizing the control program; an initiating instruction receiving unit for receiving a program initiating instruction of the measurement process by the measuring unit through the first network; and a measurement control unit for letting the measuring unit perform the measurement process based on the control program memorized by the memorizing unit in case the initiating instruction receiving unit receives the program initiating instruction.

Further, it is preferable that the measuring device controlling adapter is coupled to a second network; and the measurement control unit includes, a command generating unit for generating a control command which controls the measuring unit; a command transferring unit for transferring the control command to the measuring unit through the second network; and a measurement result receiving unit for receiving a measurement result of the measurement process from the measuring unit.

Further, it is preferable that the measuring device controlling adapter also includes a measurement result transferring unit for transferring the measurement result through the first network.

Further, it is preferable that the measuring device controlling adapter also includes a transfer destination receiving unit for receiving the identification information of the transfer destination of the measurement result through the first network; and a transfer destination registration unit for storing the received identification information of the transfer destination in the transfer destination memorizing unit.

Further, it is preferable that the program receiving unit receives at least a portion of each of a plurality of the control programs, the memorizing unit memorizes a plurality of the control programs, and the command generating unit selects the control program being performed from the memorizing unit based on the program initiating instruction and generates the control command based on the control program.

Further, it is preferable that the measurement result transferring unit converts the measurement result into data of a predetermined format, and transfers an object having the measurement result converted in the predetermined data format and information for reconverting the converted measurement result into the original one for the second network.

Further, it is preferable that the measuring device controlling adapter also includes an error detecting unit for detecting a predetermined error during the measurement process; and an error information transferring unit for transferring information relating to the error through the first network.

Further, it is preferable that the first network is Ethernet and that the second network is GPIB.

Further, it is preferable that the measuring device controlling adapter also includes a program running unit capable of executing a program described in Java™ language, wherein the control program is described in Java language, and at least one of the command generating unit and the command transferring unit is embodied by the program running unit which executes the control program.

According to the second embodiment of the present invention, there is provided a measuring device including a measuring device controlling adapter claimed in claim 1 and the measuring unit for performing the measurement process.

Further, it is also preferable that the initiating instruction receiving unit receives a program initiating instruction of the control program from the first network and that the measuring device further includes a processing information transferring unit for transferring information relating to the measurement process through the first network.

Further, it is preferable that the measuring device is coupled to a third network, the control program also includes contents relating to another measurement process performed by another measuring device coupled to the third network, and the measurement control unit further lets the other measuring device perform the other measurement process based on the control program.

Further, it is preferable that the measuring device also includes a measuring device information memorizing unit for relationally memorizing at least two (2) kinds of information respectively identifying the measurement process and the measuring device which performs the measurement process; and a measuring device identifying unit for identifying the measuring device which performs the measurement process of the control program based on information of the measuring device information memorizing unit and that the measurement control unit lets the identified measuring device perform the measurement process.

Further, it is preferable that the control program includes contents prescribing a plurality of measurement processes, that the measuring device also includes a performing sequence determining unit for determining a sequence for performing the plurality of measurement processes based on the control program and that the measurement control unit lets the plurality of measurement processes be performed according to the sequence.

Further, it is preferable that the measuring device also includes a measurement process information memorizing unit for memorizing measurement process information which identifies the measurement process which can be performed in parallel and that the measurement control unit lets the measurement process, which can be performed in parallel, be performed in parallel based on the measurement process information.

According to the third embodiment of the present invention, there is provided a measuring system including: a measuring device, which includes a measuring unit for performing a measurement process; and a control host, which controls the measurement process by the measuring device through a first network, wherein the control host includes: a program transferring unit for transferring a control program to the measuring device; and an initiating instruction transferring unit for transferring a program initiating instruction of a measurement process of the measuring device, and the measuring device includes: a program receiving unit for receiving the control program from the first network; a memorizing unit for memorizing the control program; an initiating instruction receiving unit for receiving a program initiating instruction of the measurement process; and a measurement control unit for controlling the measuring device based on the control program memorized by the memorizing unit in case the initiating instruction receiving unit receives the program initiating instruction.

Further, it is preferable that the measuring device is coupled to the control host through the first network and that the measuring system also includes a measuring device controlling adapter coupled to the measuring unit through a second network and that the measuring device controlling adapter includes: a program receiving unit for receiving a control program for controlling the measuring device from the first network; a memorizing unit for memorizing the control program; an initiating instruction receiving unit for receiving a program initiating instruction of the measurement process by the measuring unit through the first network; and a command generating unit for generating the control command based on the control program memorized by the memorizing unit in case the program initiating instruction is received; a command transferring unit for transferring the control command to the measuring device through the second network based on the control program memorized by the memorizing unit; and a measurement result receiving unit for receiving a measurement result of the measurement process from the measuring device, and the measuring unit includes: a measuring unit for performing a measurement process based on the transferred control command; and a measurement result transferring unit for transferring the measurement result of the measurement process to the measuring device controlling adapter.

Further, it is preferable that the measuring system also includes a display host for displaying a result of the measurement process by the measuring device, the display host being coupled to the measuring device controlling adapter through the first network and that the measuring device controlling adapter includes a measurement result transferring unit for transferring the measurement result through the first network, and the display host includes a second measurement result receiving unit for receiving the measurement result transferred from the measurement result transferring unit; and a display unit for displaying the measurement result.

Further, it is preferable that the measuring device controlling adapter also includes: a transfer destination memorizing unit for memorizing identification information of the display host which is a transfer destination of the measurement result; a transfer destination receiving unit for receiving the identification information of the display host which is a transfer destination of the measurement result through the first network; and a transfer destination registration unit for memorizing the received identification information in the transfer destination memorizing unit, and the measurement result transferring unit transfers the measurement result to the display host of the transfer destination based on the identification information, and the display host further includes: a transfer destination information transferring unit for transferring the identification in formation of the display host to the measuring device controlling adapter through the first network.

Further, it is preferable that the measuring device controlling adapter also includes: an error detecting unit for detecting a predetermined error during the measurement process; and an error information transferring unit for transferring information relating to the error to the control host through the first network, and the control host further includes: an error information receiving unit for receiving information relating to a transferred error through the first network; and an error display unit for displaying the received information relating to an error.

Further, it is preferable that the control host also includes an initiating instruction transferring unit for transferring a program initiating instruction of the control program, and the initiating instruction transferring unit receives the program initiating instruction through the first network.

Further, it is preferable that the measuring device also includes a processing information transferring unit for transferring processing information relating to the measurement process to the control host through the first network, and the control host further includes; a processing information receiving unit for receiving the processing information transferred from the processing information transferring unit; and a display unit for displaying the processing information.

Further, it is also preferable that the measuring device is further coupled to another network, the control program further includes contents relating to other measurement process performed by other measuring device coupled to the other network, and the measurement control unit further controls other measurement process by the other measuring device based on the control program.

Further, it is preferable that the measuring system also includes a measuring device information memorizing unit for relationally memorizing at least two (2) kinds of information respectively identifying the measurement process and the measuring device which performs the measurement process; and a measuring device identifying unit for identifying the measuring device which performs the measurement process of the control program based on information of the measuring device information memorizing unit and that the measurement control unit lets the identified measuring device perform the measurement process.

Further, it is also preferable that the control program includes contents prescribing a plurality of the measurement processes, that the measuring system further includes a performing sequence determining unit for determining a sequence for performing the plurality of measurement processes based on the control program and that the measurement control unit lets the plurality of measurement processes be performed according to the sequence.

Further, it is preferable that the measuring system also includes a measurement process information memorizing unit for memorizing measurement process information which identifies the measurement process which can be performed in parallel and that the measurement control unit lets the measurement process, which can be performed in parallel, be performed in parallel based on the measurement process information.

According to the fourth embodiment of the present invention, there is provided a measuring device controller coupled to a network for controlling a measuring device performing a measurement process including: a program memorizing unit for memorizing a control program which includes contents prescribing the measurement process; a measuring device detecting unit for detecting the measuring device which performs the measurement process based on the control program; and a measurement control unit for letting the detected measuring unit perform the measurement process based on the control program through the network.

According to the fifth embodiment of the present invention, there is provided a measuring device controller coupled to a network for controlling a measuring device performing a measurement process including: a program memorizing unit for memorizing a control program which includes a content prescribing the measurement process; a parallel process detecting unit for detecting a plurality of measurement processes which can be performed in parallel from the measurement processes based on the control program; and a measurement control unit for letting the measuring unit perform the plurality of measurement processes detected by the parallel process detecting unit in parallel.

According to the sixth embodiment of the present invention, there is provided a measurement process performing method for letting a measuring device coupled through a network perform a measurement process, wherein the measuring device has a measuring unit for performing the measurement process, including: a program receiving step for receiving a control program for controlling the measuring unit through the network; an initiating instruction receiving step for receiving a program initiating instruction of the control program; and a control step for controlling the measurement process by the measuring unit based on the control program in case the program initiating instruction is received.

Further, it is also preferable that the control step includes: a command generating step for generating a control command based on the control program; a measuring command transferring step for transferring the generated control command to the measuring device; a measurement result receiving step for receiving a measurement result; and a measurement result transferring unit for transferring the measurement result through the first network.

According to the sixth embodiment of the present invention, there is provided a recording medium on which a program for letting a measuring device coupled through a network perform a measurement process, wherein the measuring device has a measuring unit for performing the measurement process, is recorded including: a program receiving module for activating reception of a control program, which includes contents relating to the measurement process, from the network; a memorizing module for storing the control program; and an initiating instruction receiving module for activating reception of a program initiating instruction of the control program.

This summary of the invention does not necessarily describe all necessary features so that the invention may also be a sub-combination of these described features.

BRIEF DESCRIPTION OF THE DRAWINGS

FIG. 6 is an example of a control program according to an embodiment of the present invention.

FIG. 15 is an example of a control program of the measuring system according to the third embodiment of the present invention.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Now, referring to the attached drawings, embodiments of the present invention are described in detail. The embodiments described hereafter should not be construed to be limiting the scope of the present invention defined by the claims, and the features of the present invention described according to the embodiments should not be construed to be essential to practice technical ideas of the present invention.

Figure 1:
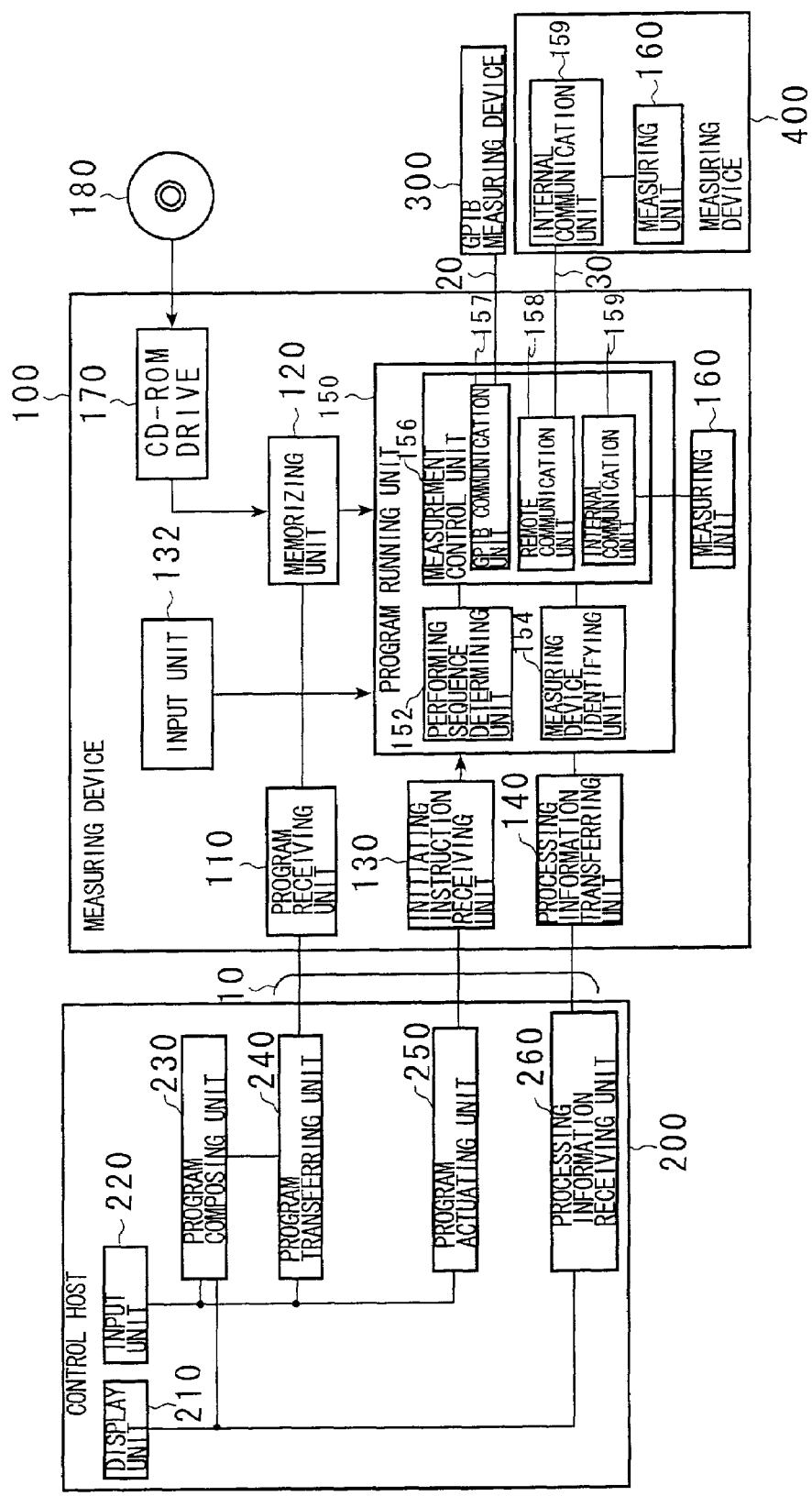
FIG. 1 is a block diagram of a measuring system according to an embodiment of the present invention.

FIG. 1 is a block diagram of a measuring system according to an embodiment of the present invention. The measuring system includes control host 200, a measuring device 100, GPIB measuring device 300 and another measuring device 400. The control host 200 is coupled to the measuring device 100 by a network 10. The measuring device 100 is coupled to the GPIB measuring device 300 by the GPIB 20. The measuring device 100 is coupled to the measuring device 400 by a network 30. Each of the networks 10 and 30 is preferably Ethernet, IEEE1394, GPIB, a serial bus or a parallel bus, etc.

The control host 200 includes a display unit 210, an input unit 220, a program composing unit 230, a program transferring unit 240, a program actuating unit 250 and a processing information receiving unit 260. According to the present embodiment, the control host 200 is a personal computer having an operating system such as Microsoft™ Windows™ 95. According to the present embodiment, each of the units 210, 220, 230, 240, 250 and 260 are embodied by a personal computer running remote applications.

The input unit 220 has, for example, a mouse, keyboard, etc. and receives various input kinds from a user. According to the present embodiment, the input unit 220 receives (a) text type input (s) of a control program in Java™ language from the user. The input unit 220 also receives an instruction to send the control program. Further, the input unit 220 receives an instruction ("a program initiating instruction") to start running the control program which should be run. Still further, the input unit 220 receives an instruction ("a program suspending instruction") to stop running the control program.

The display unit 210 has a display device and displays various kinds of information.

Figure 2:
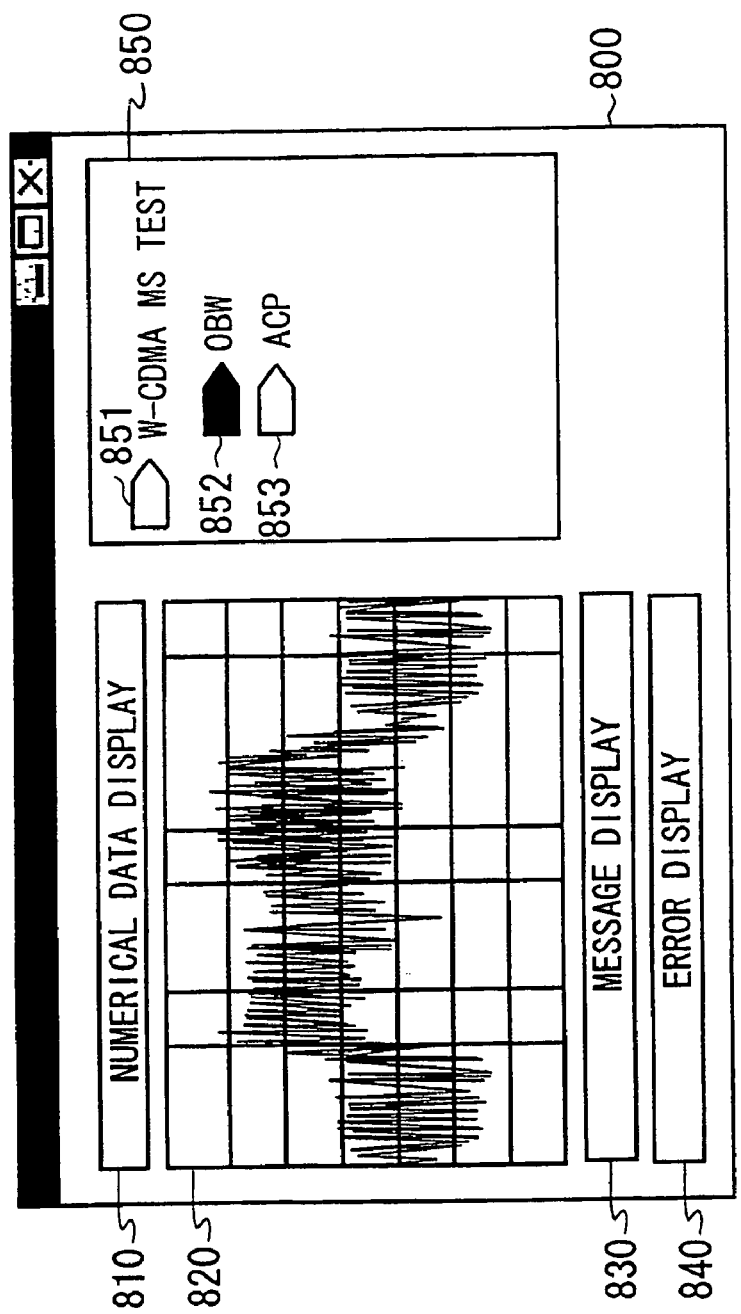
FIG. 2 is a schematic diagram of a display image displayed on the display unit according to the present embodiment of the present invention.

FIG. 2 is a schematic diagram of a display image 800 displayed on the display unit according to the present embodiment of the present invention. FIG. 2 a display image 800 in case of performing a measurement process for Occupied Bandwidth ("OBW") and Adjacent Channel Leakage Power ("ACP") of a cellular phone system. The display image displayed by the display unit 210 includes a numerical data display section 810, a waveform data display section 820, a message display section 830, an error display section 840 and a task display section 850.

The numerical data display section 810 displays a measured result of numerical data received by the processing information receiving unit 260. The waveform data display section 820 displays a measured result of waveform data received by the processing information receiving unit 260. The message display section 830 displays messages received by the processing information receiving unit 260 from the measuring device 100, etc. The error display section 840 displays error information received by the processing information receiving unit 260 from the measuring device 100, etc. The task display section 850 displays states of tasks being performed by the measuring device 100, the states of tasks being received by the processing information receiving unit 260. On the task display section 850, icons for performed tasks are displayed in different colors depending on the fact that the task designated by the icon is completed (e.g. icon 852) or being performed (e.g. icons 851 and 853). Here, the "task" may mean a union of specific process (es). For example, only one measuring process can be a"task", and, in some cases, a plurality of measuring processes can also be a "task".

Referring back to FIG. 1, the program composing unit 230 lets the display unit 210 display a user interface for describing a control program, and provides a program developing environment where a user can compose and/or edit a program by the user interface through the input unit 220. According to the present embodiment, in order that the control program may be composed in Java language, the program composing unit 230 is constructed to let a CPU (Central Processing Unit) (not shown) run a program providing Java program developing environment of, such as, VisualCafe™ of Symantec ™.

The program transferring unit 240 sends a control program to the measuring device 100 when an instruction to send the control program is received by the input unit 220. The program actuating unit 250 sends a program initiating instruction to the measuring device 100 in response to the program initiating instruction for the control program that is inputted through the input unit 220. Further, according to the present embodiment, the program actuating unit 250 sends a program suspending instruction to the measuring device 100 in response to the program suspending instruction for the control program that is inputted through the input unit 220. The processing information receiving unit 260 receives various kinds of information relating to the measuring process from the measuring device 100. According to the present embodiment, the processing information receiving unit 260 receives measurement results including numerical data or waveform data by the measurement process, messages, error information, task performing states, etc.

The measuring device 100 includes a program receiving unit 110, a memorizing unit 120 as an example of a memorizing unit for information on the measuring device and a memorizing unit for information on measurement process, an initiating instruction receiving unit 130 as an example of an initiating instruction receiving unit, an input unit 132 as another example of an initiating instruction receiving unit, a processing information transferring unit 140, a program running unit 150, a measuring unit 160 having a function of a measuring device and a CD-ROM drive 170. The program receiving unit 110 receives a control program from the control host 200 via the network 10.

The memorizing unit 120 stores the control program received by the program receiving unit 110. The memorizing unit 120 stores a plurality of identification information of the control host 200, the control host being an information source of various information relating to a measurement process. The memorizing unit 120 stores various kinds of programs called by a control program. The memorizing unit 120 also stores identification information (e.g. names of tasks) which indicates a measurement process, identification information of a measuring device which performs the measurement process, a protocol of a network coupled to the measuring device and an address of the measuring device on the network. The memorizing unit 120 further stores identification information (e.g. names of tasks) of measurement processes which can be performed in parallel.

The memorizing unit 120 may be a semiconductor memory device including a RAM (Random Access Memory) or a rewritable ROM (Read Only Memory) such as EPROM (Erasable Programmable ROM), or a magnetic memory device including a floppy disk or a hard disk, or an optical memory device including a CD-R. Further, the memory device 120 manages the control program or data by using a file managing system (not shown).

The initiating instruction receiving unit 130 receives a program initiating instruction and a program suspending instruction from the control host 200 through the network 10. The processing information transferring unit 140 sends various kinds of information related to a measuring processes to the control host 200 of which the identification information is stored in the memorizing unit 120. According to the present embodiment, the processing information transferring unit 140 sends information related to a measuring process including measurement results of numerical data or waveform data, messages, error information and task performing states.

The input unit 132 has input devices such as a mouse or a keyboard, and receives various input kinds from a user. According to the present invention, the input unit 132 receives a program initiating instruction of a control program from a user.

The program running unit 150 runs the control program stored in the memorizing unit 120 when the initiating instruction receiving unit 130 receives a program initiating instruction or the input unit 132 receives a program initiating instruction. According to the present invention, the program running unit 150 retrieves a control program corresponding to the program initiating instruction from the memorizing unit 120 and runs the retrieved control program. Further, the program running unit 150 stops running the control program when the initiating instruction receiving unit 130 receives a program suspending instruction. According to the present embodiment, the program running unit 150 starts or stops running the control program based on instructions from a user interface (not shown) of the measuring device 100.

The program running unit 150 includes a performing sequence determining unit 152, a measuring device identifying unit 154 and a measurement control unit 156. Each of these units 152, 154 and 156 is constructed by means of running the control program by the program running unit 150. The performing sequence determining unit 152 determines a sequence for performing measurement processes of a control program based on identification information (e.g. names of tasks) stored in the memorizing unit 120 of measurement processes which can be performed in parallel. In other words, the performing sequence determining unit 152 recognizes measurement processes which can be performed in parallel to be performed in parallel, and determines the performing sequence for the measurement processes which can not be performed in parallel. By this way, since the performing sequence determining unit 152 can determine measurement processes which can be performed in parallel, a user can compose a control program without investigating whether or not a measurement process can be performed in parallel with others or specifying that a measurement process should be performed in parallel with another measurement process.

The measuring device identifying unit 154 identifies a measuring device performing a measurement process (es) of the control program based on information stored in the memorizing unit 120. According to the present embodiment, the measuring device identifying unit 154 identifies identification information of a measuring device which performs a measurement process (es) described in the control program based on information stored in the memorizing unit 120.

The measurement control unit 156 includes a GPIB communication unit 157, a remote communication unit 158 and an internal communication unit 159, and controls performances of measurement processes of the control program by using the GPIB communication unit 157, the remote communication unit 158 and the internal communication unit 159. According to the present embodiment, the measurement control unit 156 lets measurement process (es), which is recognized to be performed in parallel by the performing sequence determining unit 152, be performed in parallel and measurement processes, for which a performing sequence is determined, be performed according to the determined sequence. Further, the measurement control unit 156 selects a communication unit for controlling measurement process (es) performed by a measuring device identified by the measuring device identifying unit 154 from the GPIB communication unit 157, the remote communication unit 158 and the internal communication unit 159, and lets the selected communication unit control the identified measuring device.

According to the present embodiment, the measurement control unit 156 retrieves a protocol of a network coupled to the measuring device identified by the measuring device identifying unit 154 and the address of the measuring device on the network from the memorizing unit 120, selects a communication unit for performing controls over the measuring process (es) through the network protocol and controls the selected communication unit by using the retrieved address. By this way, since the measurement control unit 156 can select a communication unit, a user can compose a control program without describing that a communication unit should be selected.

The GPIB communication unit 157 sends a control command (s) for controlling the GPIB measuring device 300 through the GPIB 20 and receives measuring results from the GPIB measuring device 300. The remote communication unit 158 sends a control command (s) for controlling the measuring device 400 through the network 30 and receives measuring results from the measuring device 400. The internal communication unit 159 sends a control command (s) to the measuring unit 160 and receives measuring results from the measuring device 400.

The measuring unit 160 performs a measuring process for a predetermined object. For example, the measuring unit 160 may preferably be a passive or active device or a hardware or a firmware needed for assessment, test, correction, repair, adjustment, such as a signal generator, a modulator, a demodulator, an input/output device, an amplifier, a mixer, an encoder, a decoder, an oscilloscope, a distortion meter, a power meter, a multimeter, an attenuator, a spectrum analyser, a network analyser, a semiconductor tester, a synthesizer, a constant temperature device, etc.

The CD-ROM drive 170 retrieves programs from a CD-ROM 180 as an example of recording media and transfers them to the memorizing unit 120. Here, there may be used optical recording media including DVD (Digital Video Disc), magnetic recording media including MO (Magneto-Optical) disc and magnetic recording media including floppy disc as the recording media. According to the present embodiment, a program providing a function for performing a control program of the program running unit 150, a program receiving module for forming the program receiving unit 110, an initiating instruction receiving module for forming the initiating instruction receiving unit 130 and a memory module for forming the memorizing unit 120 are recorded on the CD-ROM 180, retrieved by the CD-ROM drive 170 and installed on the memorizing unit 120. These programs and modules are retrieved and run by the CPU (not shown) of the measuring device 100 from the memorizing unit 120.

The GPIB measuring device 300 performs a measuring process on a predetermined object based on transferred control command through the GPIB 20, and sends measuring results to the measuring device 100 through the GPIB 20. The measuring device 400 includes an internal communication unit 159 and a measuring unit 160.

Figure 3:
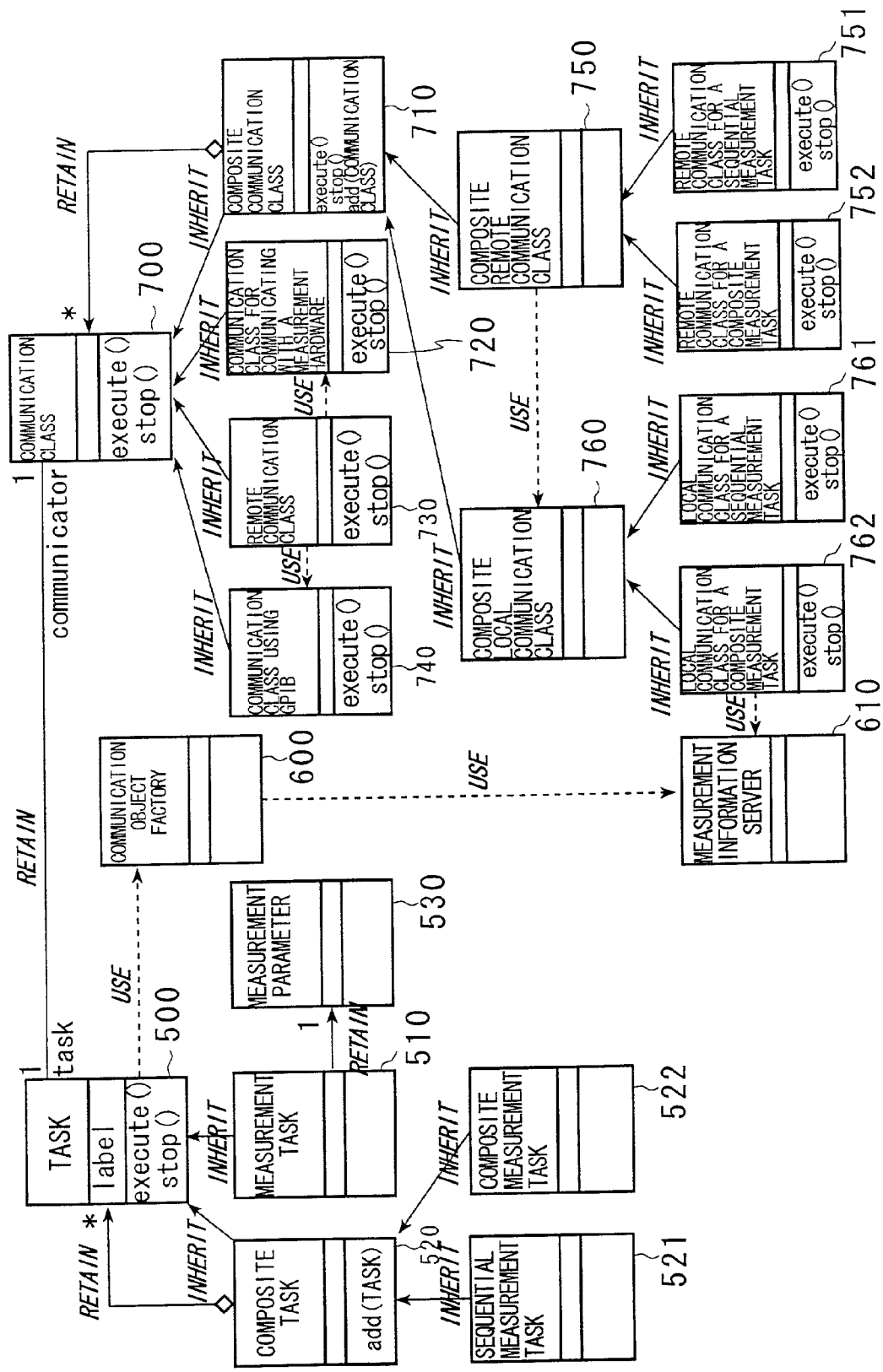
FIG. 3 is a schematic diagram of a class structure stored on the memorizing unit according to an embodiment of the present invention.

FIG. 3 is a schematic diagram of a class structure stored on the memorizing unit 120 according to an embodiment of the present invention. Here, a class is a unit element of a control program, and has a method as a function or an operation and a parameter. A class forms each of the above described functional units by being generated and operated as an object by the program running unit 150 on a memory area. A class can inherit contents of another class as it is. Here, in the specification of the present invention, a class which inherits another class is referred to as a "derivative class" of the inherited class. Further, an object generated by a derivative class is referred to as a derivative object of the inherited original class. Details of classes or objects are described in books for object-oriented programming or java language. The memorizing unit 120 includes a task class 500, a composite task class 520, a measurement task class 510, a measurement parameter class 530, a sequential measurement task class 521, a composite measurement task class 522, a communication object factory class 600, a measurement information server class 610, a communication class 700, a composite communication class 710, a communication class for communicating with measurement hardware 720, a remote communication class 730, a communication class using GPIB 740, a composite remote communication class 750, a composite local communication class 760, a remote communication class for a sequential measurement task 751, a remote communication class for a composite measurement task 752, a local communication class for a sequential measurement task 761 and a local communication class for a composite measurement task 762.

The task class 500 generates an object representing an abstract task performed by the control program. The task class 500 has an execute operation and a stop operation as methods. An object of the task class 500 has a function of activating a stop operation of a derivative object of the retaining communication class 700 when the execute operation is activated. Further, the object of the task class 500 has a function of memorizing a name or label of a designated object as for the control program.

The measurement task class 510 is an abstract class for generating an object, which performs a measurement task, by using an object of a retaining communication class. An object of the measurement task class 510 necessarily retains one derivative object of a measurement parameter class 530. A label of the object of the measurement task class 510 is treated as a label of a measuring device used for measurement. The composite task class 520 generates an object which gives and retains numbers to a plurality of derivative objects of the task class 500 by add operation.

The sequential measurement task class 521 generates an object, which realizes measurement by a derivative object of a retaining task according to a registered order, by using an object of a retaining communication class. The composite measurement task class 522 generates an object, which realizes a measurement process by a derivative object of retaining a task in parallel or in a registered order, by using an object of a retaining communication class. The measurement parameter class 530 is an abstract class for generating an object which memorizes a parameter used when an object of the measurement task class 510 performs a measurement task.

The measurement information server class 610 generates an object which memorizes an identification information representing a measurement process (e.g. a name of a task), identification information of a measuring device which performs the measurement process, a protocol of a network coupled to the measuring device and an address of the measuring device on the network. Further, the measurement information server class 610 generates an object which memorizes identification information (e.g. a name of a task) of a task which can be performed in parallel. The measurement information server class 610 generates an object, which receives requests for information from objects of the communication object factory class 600 and a local communication class for a composite measurement task 762 and provides corresponding information to object (s) of requesting source (s).

The communication object factory class 600 generates an object which generates a derivative object of the communication class 700 corresponding to an object of the task class 500. For example, as a derivative object of the communication class corresponding to a derivative object of the measurement task class 510, one of the derivative objects of the communication class for communicating with measurement hardware 720, the remote communication class 730, a communication class using GPIB 740 is generated.

In case the measuring device 100 has a required measuring function, the object of the communication object factory class 600 lets the derivative object of the communication class for communicating with a measurement hardware 720 be retained in the derivative object of the measurement task class 510.

Further, in case the measuring device 100 does not have a required function for a measurement process by the derivative object of the communication class 720 corresponding to the measurement task class 510, the object of the communication object factory class 600 refers to the measurement information server class 610 and searches for another measuring device having the required measuring function. Then, the object of the communication object factory class 600 generates a derivative object of a communication class 700 on another measuring device by using an object of a communication object factory class 600 which is on another measuring device found by searching. Further, the object of the communication object factory class 600 generates a derivative object of the remote communication class 730 or the composite remote communication class 750 on the measuring device 100 and lets the generated derivative object be retained in a derivative object of the task class 500.

The communication class 700 is an abstract class for generating an object which realizes communication for a measurement process. The communication class 700 has an execute operation and a stop operation. The execute operation makes a derivative object perform communication for a measurement process, and the stop operation makes a derivative object suspend communication for a measurement process. The object of the communication class 700 necessarily retains one derivative object of the task class 500 which is a generating source.

The composite communication class 710 generates an object which memorizes derivative objects of a plurality of communication classes 700. The object of the composite communication class 710 gives numbers to the derivative objects of the communication classes 700 and registers the derivative object of the communication class 700 on a retaining relation.

The communication class for communicating with a measurement hardware 720 is an abstract class for generating an object which communicates with the measuring unit 160 and realizes an execute operation and a stop operation. Therefore, a concrete class, which generates an object for communicating with the measuring unit 160 and realizing the execute and stop operation, is a derivative class of the communication class for communicating with measurement hardware 720.

The remote communication class 730 is an abstract class which generates an object for communicating with other measuring devices 300, a communication class 720 for communicating with a measuring unit 160 of other computer or a derivative object of the communication class using the GPIB 740 through a computer network such as Ethernet and realizing an execute operation and a stop operation. Therefore, a concrete class, which generates an object for communicating with the derivative object of the communication class 700 of other measuring devices and realizing the execute and stop operation, is a derivative class of the remote communication class 730.

The remote communication class 730 refers to the measurement information server class 610 if generated and searches for another measuring device 400 having the measuring function. The object of the remote communication class 730 generates a derivative object of the communication class 700 on the measuring device having the measuring function, where the measuring device is found by using the communication object factory class 600. The remote communication class 730 is remotely coupled to the generated object. For communication of an object with other measuring devices or another computer, conventional communication technology, for example a socket communication, an RMI (Remote Method Invocation) of Java Language, etc., is used.

The communication class using the GPIB 740 is an abstract class which generates an object for communicating with other measuring devices 300 coupled through the GPIB and realizing an execute operation and a stop operation. A concrete class, which generates an object for communicating with other measuring devices 300 coupled through GPIB and realizing the execute and stop operation, is a derivative class of the communication class using the GPIB 740.

The composite remote communication class 750 is an abstract class which generates an object for communicating with a derivative object of the composite communication class 710 of other measuring device 400 and realizing an execute operation and a stop operation. For communication with an object of other measuring devices 400, conventional communication technology, for example socket communication, RMI of Java Language, etc., is used.

The remote communication class for a sequential measurement task 751 generates an object for communicating with an object of the local communication class for a sequential measurement task 761 of other measuring devices 400 and realizing an execute operation and a stop operation. An object of the remote communication class for a sequential measurement task 751 activates an execute operation of an object of the local communication class for a sequential measurement task 761 of the other measuring devices 400 for its own execute operation and a stop operation of an object of the local communication class for a sequential measurement task 761 of the other measuring devices 400 for its own stop operation.

The remote communication class for a composite measurement task 752 generates an object for communicating with an object of the local communication class for a composite measurement task 762 of other measuring devices 400 and realizing an execute operation and a stop operation. The communication class using the GPIB 740 is an abstract class which generates an object for realizing an execute operation and a stop operation by using the measuring device 300 coupled through the GPIB. The composite local communication class 760 is an abstract class which generates an object for realizing an execute operation and a stop operation of a derivative object of retaining a plurality of communication classes 700.

The local communication class for a sequential measurement task 761 generates an object for activating execute operations of retaining communication classes 700 in a sequence of numbers from the lowest one. The object of the local communication class for a sequential measurement task 761 activates an execute operation of a derivative object of the communication class 700 in a sequence of numbers registered on retaining relation from the lowest number. In this case, until an execute operation of a derivative object of one of the communication classes 700 is completed, an execute operation of a derivative object of the next one of the communication classes 700 is not activated. In case of stop operation, stop operations of derivative objects of all communication classes 700 registered on retaining relation are performed.

The local communication class for a composite measurement task 762 generates an object for referring to the measurement information server class 610 and activating an execute operation of a derivative object of retaining communication class 700 in parallel or in a sequence of numbers from the lowest one. The object of the local communication class for a composite measurement task 762 activates execute operations on a plurality of derivative objects, which can be performed in parallel, of retaining communication classes 700 by means of execute operation in case the derivative objects of the retaining communication classes 700 can be performed in parallel.

In case the derivative objects of the retaining communication classes 700 cannot be performed in parallel, the execute operations of the derivative objects of the retaining communication classes 700 are activated in a sequence of numbers registered on a retaining relation from the lowest one. In this case, until an execute operation of a derivative object of one of the communication classes 700 is completed, an execute operation of a derivative object of the next one of the communication classes 700 is not activated. In case of stop operation, stop operations of derivative objects of all communication classes 700 registered on retaining relation are performed.

The performing sequence determining unit 152 is mainly formed by the composite communication class 710 or the object of the derivative class of the composite communication class 710. The measuring device identifying unit 154 is mainly formed by the communication object factory class 600. The GPIB communication unit 157 is mainly formed by the communication class using the GPIB 740 or the object of the derivative class of the communication class using the GPIB 740. The remote communication unit 158 is mainly formed by the remote communication class 730 or the object of the derivative class of the remote communication class 730. The internal communication unit 159 is mainly formed by the communication class for communicating with measurement hardware 720 or the object of the derivative class of the communication class for communicating with measurement hardware 720.

Figure 4:
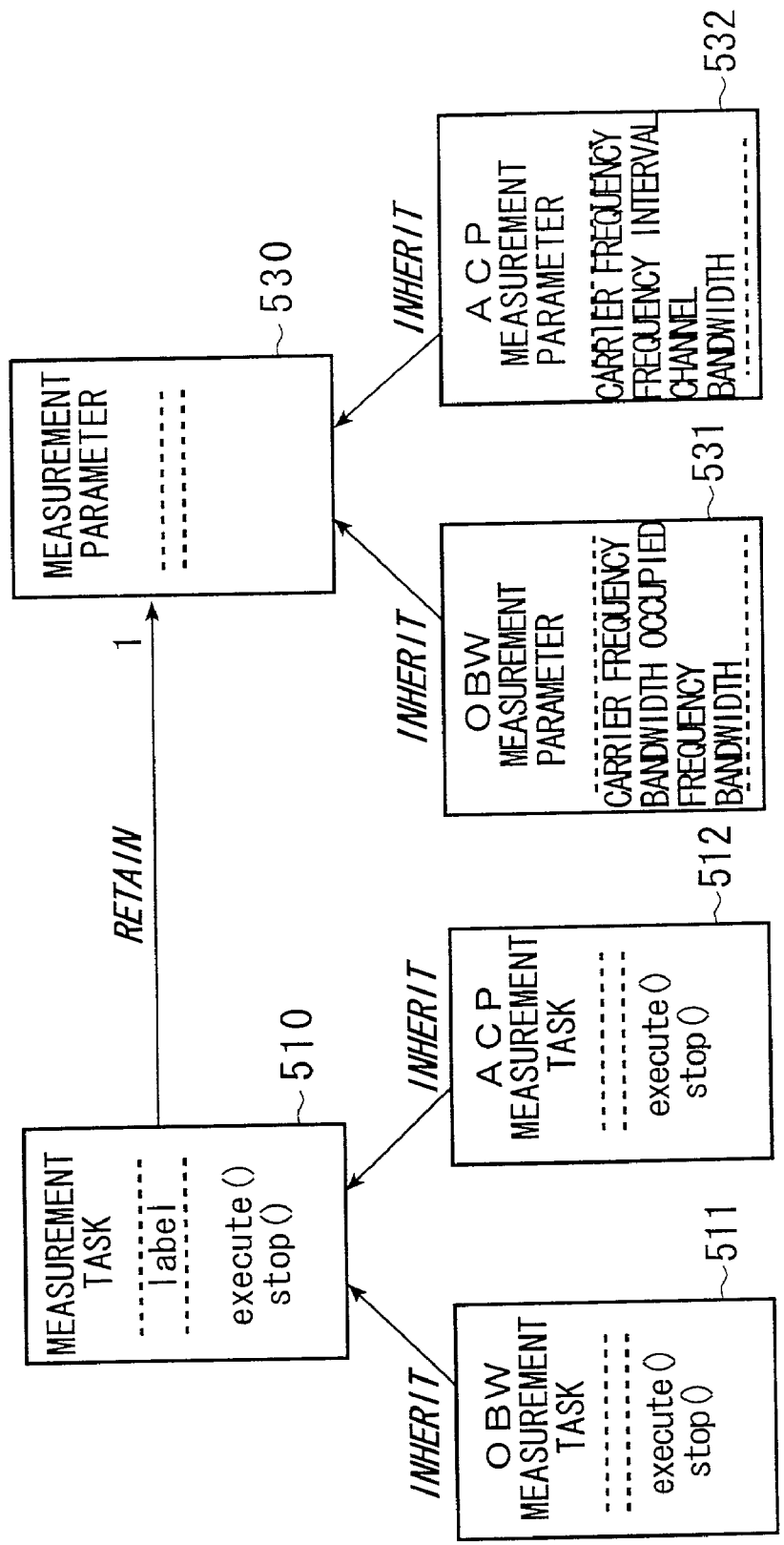
FIG. 4 is a schematic diagram of a more concrete example of the classes stored on the memorizing unit according to an embodiment of the present invention.

FIG. 4 is a schematic diagram of a more concrete example of the classes stored on the memorizing unit 120 according to an embodiment of the present invention. The classes shown in FIG. 4 are a portion of classes used for performing measurement processes of OBW and ACP of a cellular phone. Here, the measurement process of OBW is to measure a frequency bandwidth corresponding to a predetermined percentage of full power of a designated frequency bandwidth which is a carrier frequency of the cellular phone where the cellular phone is in the state of transmitting signals. Further, the measurement process of ACP is to measure a link power of an adjacent channel to the transmission power of a designated channel where the cellular phone is in the state of transmitting signals.

An OBW measurement task class 511 inherits the measurement task class 510 and generates an object for performing the task of the OBW measurement process. An ACP measurement task class 511 inherits the measurement task class 510 and generates an object for performing the task of the ACP measurement process.

An OBW measurement parameter class 531 inherits the measurement parameter class 530 and generates an object for memorizing parameters used for the OBW measurement process. The parameter includes a carrier frequency, a bandwidth and an occupied frequency bandwidth. The object of the OBW measurement parameter class 531 retains an object of the OBW measurement task class 511.

An ACP measurement parameter class 532 inherits the measurement parameter class 530 and generates an object for memorizing parameters used for the ACP measurement process. The parameter includes a carrier frequency, a frequency interval and a channel bandwidth. The object of the ACP measurement parameter class 532 retains an object of the ACP measurement task class 512.

Figure 5:
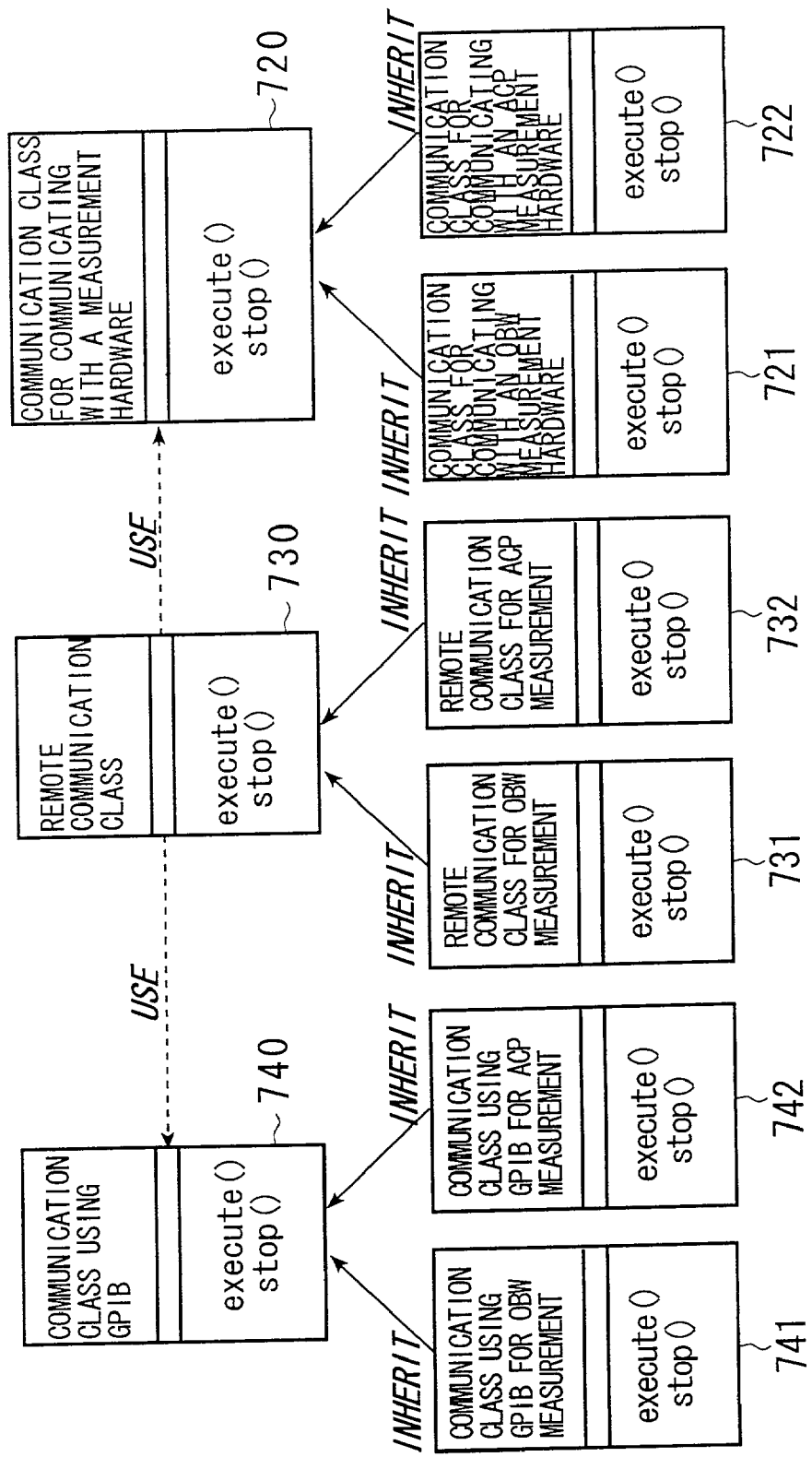
FIG. 5 is a schematic diagram of a more concrete example of the classes stored on the memorizing unit according to an embodiment of the present invention.

FIG. 5 is a schematic diagram of a more concrete example of the classes stored on the memorizing unit 120 according to an embodiment of the present invention. The classes shown in FIG. are another portion of classes used for performing measurement processes of OBW and ACP of a cellular phone.

A communication class for communicating with OBW measurement hardware 721 inherits the communication class for communicating with measurement hardware 720. An object of the communication class for communicating with OBW measurement hardware 721 is retained in an object of the OBW measurement task class 511 when a measurement process is performed on the measuring unit 160 of the measuring device 100. The object of the communication class for communicating with OBW measurement hardware 721 generates a measurement parameter of the measuring unit 160 from an attribute of an object of the OBW measurement parameter class 531 retained by the object of the OBW measurement task class 511 and sets the generated parameter on the measuring unit 160 when an execute operation is activated by the object of the OBW measurement task class 511. The object of the communication class for communicating with OBW measurement hardware 721 measures an occupied frequency bandwidth by using the measuring unit 160.

A communication class for communicating with ACP measurement hardware 722 inherits the communication class for communicating with measurement hardware 720. An object of the communication class for communicating with ACP measurement hardware 722 is retained in an object of the ACP measurement task class 512 when a measurement process is performed on the measuring unit 160 of the measuring device 100. The object of the communication class for communicating with ACP measurement hardware 722 generates a measurement parameter of the measuring unit 160 from an attribute of an object of the ACP measurement parameter class 532 retained by the object of the ACP measurement task class 512 and sets the generated parameter on the measuring unit 160 when an execute operation is activated by the object of the ACP measurement task class 512. Then, the object of the communication class for communicating with ACP measurement hardware 722 measures a ratio of link power of an adjacent channel to a transmission channel by using the measuring unit 160.

A remote communication class for OBW measurement 731 inherits the remote communication class 730. An object of the remote communication for OBW measurement 731 is generated by the communication object factory class 600 when a measurement process is performed by the measuring device 400 and retained in the object of the OBW measurement task class 511. The object of the remote communication for OBW measurement 731 communicates with the object of the communication class for communicating with an OBW measurement hardware 721 or a communication class using the GPIB for OBW measurement 741 and measures a frequency bandwidth corresponding to a predetermined percentage.

A remote communication class for ACP measurement 732 inherits the remote communication class 730. An object of the remote communication for ACP measurement 732 is generated by the communication object factory class 600 when a measurement process is performed by the measuring device 400 and retained in the object of the ACP measurement task class 512. The object of the remote communication for ACP measurement 732 communicates with the object of the communication class for communicating with ACP measurement hardware 722 or a communication class using GPIB for ACP measurement 742 and measures a ratio of link power of an adjacent channel to a transmission channel.

The communication class using the GPIB for OBW measurement 741 inherits the communication class using the GPIB 740. An object of the communication class using the GPIB for OBW measurement 741 is generated by the communication object factory class 600 when a measurement process is performed by a measuring device coupled to the measuring device 300 through the GPIB 20 and retained in the object of the OBW measurement task class 511. The object of the communication class using the GPIB for OBW measurement 741 generates a measurement parameter of the measuring unit 160 from an attribute of an object of the OBW measurement parameter class 531 retained by the object of the OBW measurement task class 511 and sets the generated parameter on the measuring unit 300 by corresponding GPIB command when an execute operation is activated by the object of the OBW measurement task class 511. Then, the object of the communication class using the GPIB for OBW measurement 741 controls the measuring device 300 by the GPIB command and measures a frequency bandwidth occupying a designated percentage.

The communication class using the GPIB for ACP measurement 742 inherits the communication class using the GPIB 740. An object of the communication class using the GPIB for ACP measurement 742 is generated by the communication object factory class 600 when a measurement process is performed by a measuring device coupled to the measuring device 300 through the GPIB 20 and retained in the object of the ACP measurement task class 512. The object of the communication class using the GPIB for ACP measurement 742 generates a measurement parameter of the measuring unit 160 from an attribute of an object of the ACP measurement parameter class 532 retained by the object of the ACP measurement task class 512 and sets the generated parameter on the measuring unit 300 by corresponding the GPIB command when an execute operation is activated by the object of the ACP measurement task class 512. Then, the object of the communication class using the GPIB for ACP measurement 742 controls the measuring device 300 by the GPIB command and measures a ratio of link power of an adjacent channel to a transmission channel.

FIG. 6 is an example of a control program according to an embodiment of the present invention. FIG. 6 is an example of a control program, which a user should describe for performing an OBW measurement process and an ACP measurement process. Line 1 is a description for generating an object of the composite measurement task class 522. Line 2 is a description for generating an object of the OBW measurement task class 511 in order to perform a task of the OBW measurement task. Line 3 is a description for setting parameters on an object of the OBW measurement parameter class 531 retained by the object of the OBW measurement task class 511. Line 4 is a description for generating an object of the ACP measurement task class 512 in order to perform the ACP measurement process.

Line 5 is a description for setting parameters on an object of the ACP measurement parameter class 532 retained by the object of the ACP measurement task class 512. Line 6 is a description for adding the object of the OBW measurement task class 511 to the retaining relation of the object of the composite measurement task class 522. Line 7 is a description for adding the object of the ACP measurement task class 512 to the retaining relation of the object of the composite measurement task class 522. "try {"of the line 0 and "}" of line 8 is a description for representing the lines from line 0 to line 8 or from line 1 to line 7 to be an exception handling, as described in detail hereinafter. Line 9 is a description for storing information on exceptions occurred to tasks. Line 10 is a description for processing of an exception in case it happens, in other words, interpreting a variable e and processing according to the interpreted variable e.

Here, exceptions detected may include, for example, abnormality of the measuring unit 160, communication error of a network such as the measuring unit 160 or bus, error of measurement parameters beyond allowable setup range of the measuring unit 160, a measuring device 160, 300 or 400 without power supply, a state of a measuring device controlled by another program, etc. These exceptions are preferably detected in the control of measuring device. The variable e may preferably include a line number of a program which makes an error, contents of an error, and information which can identify performed contents of program statement during the exception happens.

As for the exception making structure, it is preferable to define an exception regarding a derivative object of a class (task exception class) which is a target to detect a task exception. In this way, it is possible to catch detailed exceptions regarding each derivative objective of task exception classes. According to the present invention, exception handling is embodied by using the exception handling function of Java language. In other words, the exception handling is embodied by inheriting the Exception class of Java language regarding task exception class and slowing exceptions happened in a derivative object.

As described above, a user can perform a measurement process by doing only a simple and possible description, for example designating a name of a task which generates an object performing a desired task of measurement process, without knowing features of the measuring devices. Further, in case an exception has happened, it is possible to easily verify the contents of exceptions and the running sequence of statements of the control program where an exception has happened.

Figure 7:
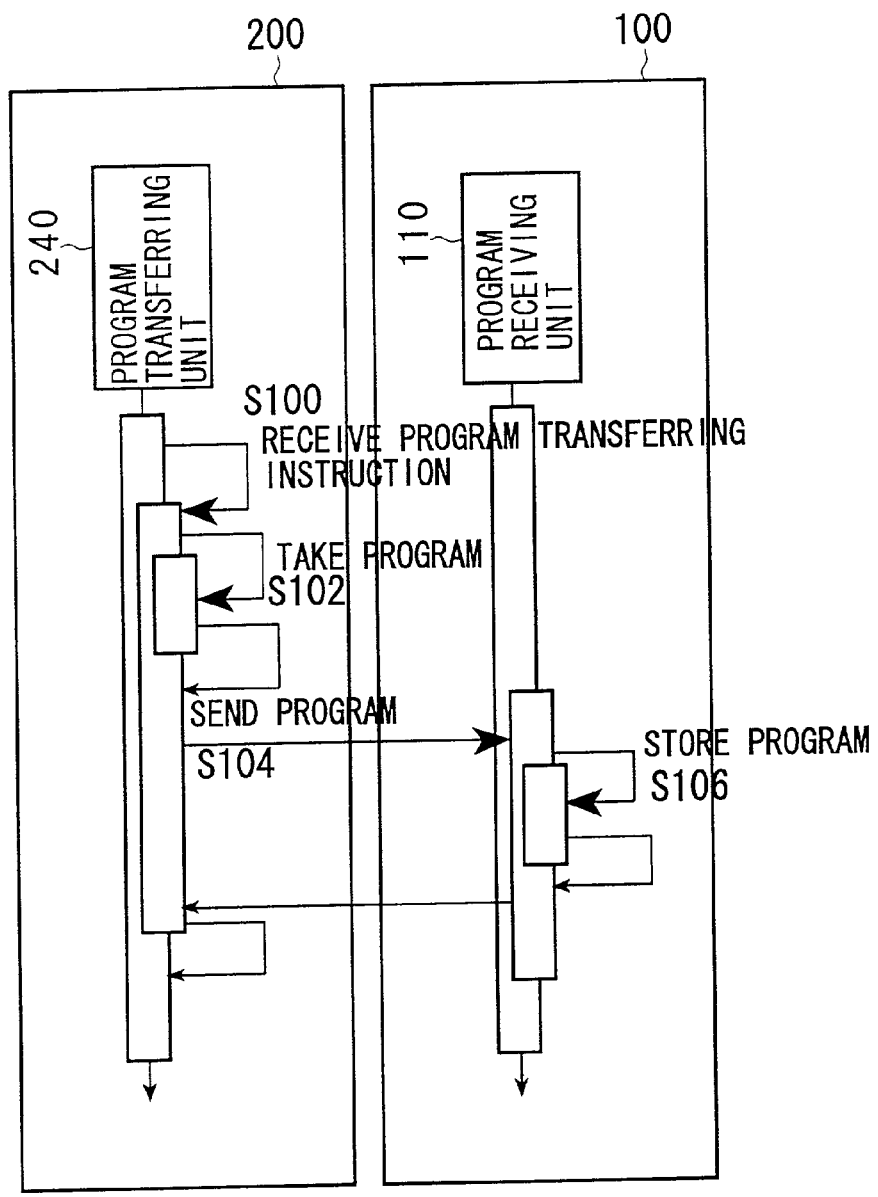
FIG. 7 is a mapping trace diagram showing operations of the measurement system according to an embodiment of the present invention.

FIG. 7 is a mapping trace diagram showing operations of the measurement system according to an embodiment of the present invention. In FIG. 7, states and operations of the units are shown while time flows from top to bottom, where a box continued at the bottom of each unit represents an object forming each of the units or an operation of the object, big arrows represent activations of operations of objects and small arrows represent returns of the results of the operations of the objects. Here, in the control host 200, the control program is composed by a user using the input unit 220 and the program composing unit 230 and stored in a memory area (not shown).

A name of a control program which should be transferred and a measuring device 100 to which the control program is transferred are received by the input unit 220 of the control host 200 (step S100), and the control program transferring unit 240 retrieves a corresponding control program from the memory area(step S102). Then, the control program retrieved by the control program transferring unit 240 is transferred to the program receiving unit 110 of the measuring device 100 (step S104). According to the present embodiment, the program transferring unit 240 is remotely coupled to the program receiving unit 110 by using RMI technology of Java language. Then, the program receiving unit 110 lets the memorizing unit 120 memorize the received control program(step S106). In this way, the control program is transferred to the measuring device 100 from the control host 200.

Figure 8:
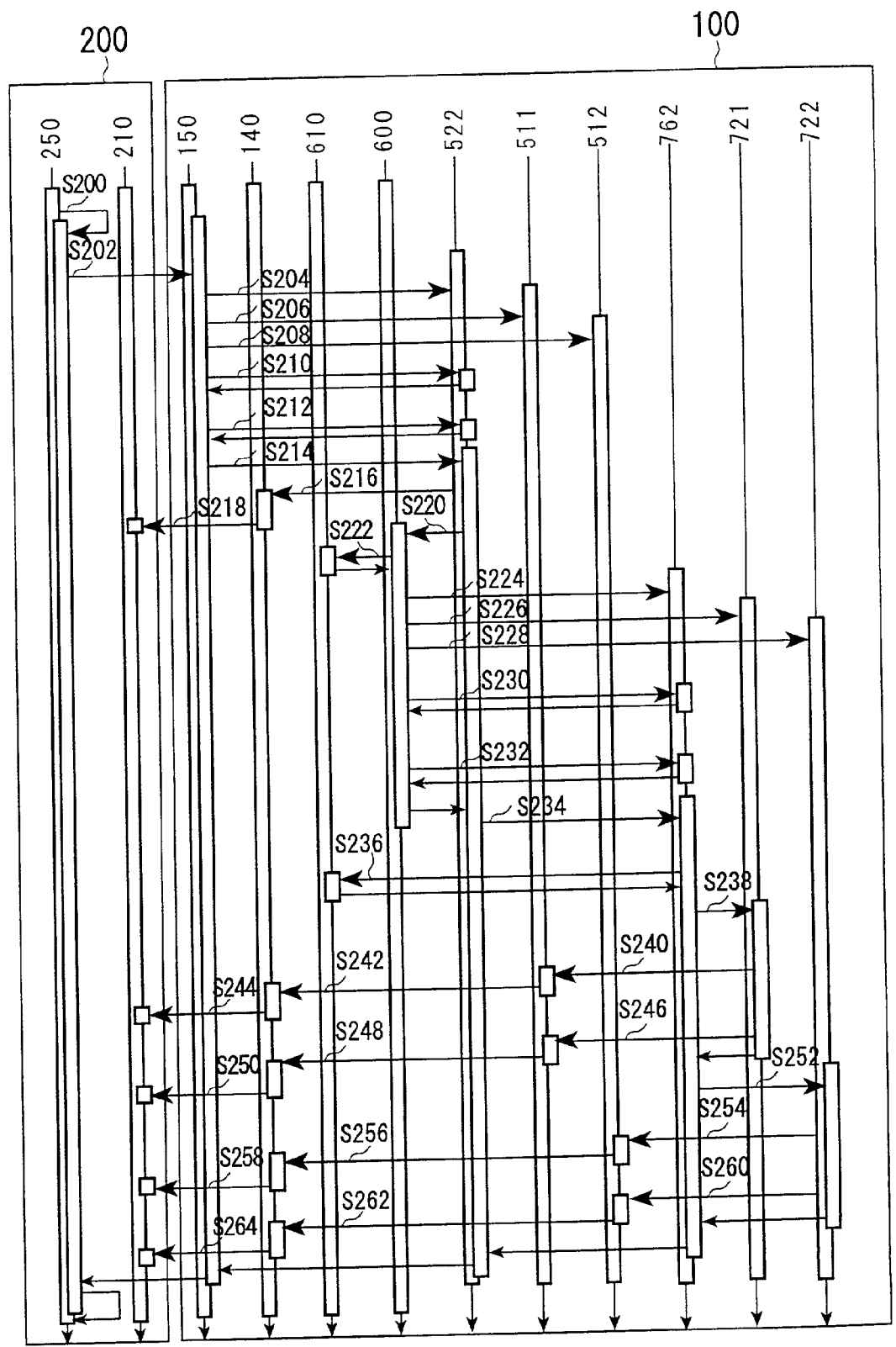
FIG. 8 is a mapping trace diagram showing operations of the measurement system according to an embodiment of the present invention.

FIG. 8 is a mapping trace diagram showing operations of the measurement system according to an embodiment of the present invention. In FIG. 8, states and operations of the units or objects of classes are shown while time flows from top to bottom, where a box continued at the bottom of each unit or class represents objects of the units or classes or operations of the objects, big arrows represent activations of operations of objects and small arrows represent returns of the results of the operations of the objects. Here, it is premised that the control program used for the operations is stored in the memory area 120 of the measuring device 100 by the operations shown in FIG. 7 before performing operations shown in FIG. 8.

When a command for initiating the control program is received by the input unit 220 of the control host 200, the program actuating unit 250 transfers a program initiating instruction to the program running unit 150 through the initiating instruction receiving unit 130 of the measuring device 100 (steps S200 and S202). Then, the program running unit 150 retrieves and initiates running of the corresponding control program from the memory area 120.

The program running unit 150 generates an object of the composite measurement task class 522, an object of the OBW measurement task class 511 and an object of the ACP measurement task class 512(steps S204, S206 and 208).

Further, the program running unit 150 adds the object of the OBW measurement task class 511 and the object of the ACP measurement task class 512 to the retaining relation of the object of the composite measurement task class 522 (steps S210 and S212).

Then, when the program running unit 150 follows the control program and the execute operation of the object of the composite measurement task class 522 is performed(step S214), the object of the composite measurement task class 522 initiates an operation for notifying a task of the object of the processing information transferring unit 140 by using the identification information of the composite measurement task class 522 as a parameter (step S216).

The processing information transferring unit 140 receives initiation of the operation for notifying the task transfers information relating to the task to the display unit 210 through the process information receiving unit 260 of the control host 200 already registered as a place to be transferred in the memorizing unit 120 (step S218). The display unit 210 displays received information relating to the task. According to the present embodiment, the display unit 210 displays icons for representing tasks performed by the objects of the composite measurement task class 522, the OBW measurement task class 511 and the ACP measurement task class 512 on the task display section 850 of the display image.

Then, the object of the composite measurement task class 522 initiates an operation for generating the object of the communication class of the object of the object factory class 600 by using itself as a parameter(step S220). The object of the object factory class 600 designates the object of the composite measurement task class 522 and performs an operation for taking information relating to the measuring device on the measuring information server class 610. Then, the object of the object factory class 600 takes information on the measuring device which can perform a measurement process by using the objects of the OBW measurement task class 511 and the ACP measurement task class 512, which are retained by the object of the composite measurement task class 522, from the object of the measurement information server class 610 (step S222).

According to the present embodiment, the object of the communication object factory class 600 takes information which identifies the measuring device capable of performing the measurement process, address of the measuring device on the network, a protocol for communicating with the measuring device as information relating to the measuring device capable of performing the measurement process. Here, it is premised that information, which identifies its own measuring device 100 as the measuring device capable of performing the tasks of the OBW measurement process and the ACP measurement process, is described in the information relating to the measuring device. In this case, the object of the communication object factory class 600 generates the object of the local communication class for a composite measurement task 762 by using the identification information of the composite measurement task class 522 as a parameter based on the taken information(step S224).

Further, the object of the communication factory class 600 generates the object of the communication class for communicating with OBW measurement hardware 721 by using the identification information of the OBW measurement task class 511, which generated the object retained by the object of the composite measurement task class 522, as a parameter (step S226). Further, the object of the communication factory class 600 generates the object of the communication class for communicating with ACP measurement hardware 722 by using the identification information of the ACP measurement task class 512, which generated the object retained by the composite measurement task class 522, as a parameter(step S228).

Then, the object of the communication factory class 600 adds the objects of the communication classes 721 and 722 for communicating with OBW measurement hardware and ACP measurement hardware to the retaining relation of the object of the local communication class for a composite measurement task 762 by additional operation of the object of the local communication class for a composite measurement task 762 (steps S230 and 232), and completes the operation for generating objects of communication classes. Then, the execute operation of the object of the local communication class for a composite measurement task 762 retained by the object of the composite measurement task class 522 is activated(step S234).

When the execute operation is activated, the object of the local communication class for a composite measurement task 762 performs the operation for investigating whether or not the measurement process can be performed in parallel against the object of the measurement information server class 610 by using the identification information of the composite measurement task class 522 as a parameter (step S236).

In this way, the object of the local communication class for a composite measurement task 762 can take information on whether or not the execute operations of the objects of the communication classes 721 and 722 for communicating with OBW measurement hardware and ACP measurement hardware can be performed simultaneously or, in other words, whether or not the measurement processes can be performed simultaneously from the object of the measurement information server class 610.

Then, in case the execute operations of the objects of the communication classes 721 and 722 for communicating with OBW measurement hardware and ACP measurement hardware can be performed simultaneously, the object of the local communication class for a composite measurement task 762 performs the execution operations of the objects of the communication classes 721 and 722 for communicating with OBW measurement hardware and ACP measurement hardware without waiting for the completion of the execution operation of the other object. These are embodied by the thread function of Java language. On the other hand, in case the execute operations of the objects of the communication classes 721 and 722 for communicating with OBW measurement hardware and ACP measurement hardware can not be performed simultaneously, the object of the local communication class for a composite measurement task 762 activates the execute operation of the object of the communication class for communicating with OBW measurement hardware 721 and, after completion of the execute operation, activates the execute operation of the object of the communication class for communicating with ACP measurement hardware 722.

Hereinafter, described is an example of the case where the execute operations of the objects of the communication classes 721 and 722 for communicating with OBW measurement hardware and ACP measurement hardware can not be performed simultaneously, according to the present embodiment. First, the object of the local communication class for a composite measurement task 762 activates the execute operation of the object of the communication class for communicating with OBW measurement hardware 721 (step S238). In this way, the object of the communication class for communicating with OBW measurement hardware 721 generates the measurement parameter of the measuring unit 160 from the attribute of the object of the OBW measurement parameter class 531 retained by the object of the OBW measurement task class 511 and sets the generated parameter on the measuring unit 160.

Then, the object of the communication class for communicating with OBW measurement hardware 721 measures an occupied frequency bandwidth by using the measuring unit 160. Then, the object of the communication class for communicating with OBW measurement hardware 721 takes the object of the waveform data as a measurement result of the measurement process from the measuring unit 160, and transfers the object of the waveform data to the object of the OBW measurement task class 511 (step S240). The object of the OBW measurement task class 511 transfers the received object of the waveform data to the display unit 210 through the processing information transferring unit 140 and the process information receiving unit 260(step S242 and S244).

According to the present embodiment, the object of the waveform data is an object which memorizes the waveform data. Further, the object of the waveform data has an operation for displaying the waveform data on the computer display device by using the object when an object for a base of display is given. For example, in a case where Java language is used, the object for a base of display is Graphics. The display unit 210 displays the waveform data on the waveform data display section 820 shown in FIG. 2 by giving the object for a base of display to the object of the waveform data and using the operation for displaying the waveform data of the object of the waveform data.

Then, when the measurement process is completed, the object of the communication class for communicating with OBW measurement hardware 721 notifies the completion of the measurement process to the objects of the OBW measurement task class 511 and the local communication class for a composite measurement task 762 (step S246) and completes the execute operation. When the notification of completion of the measurement process is received, the object of the OBW measurement task class 511 notifies the completion of the OBW measurement task to the display unit 210 through the processing information transferring unit 140 and the process information receiving unit 260 (step S248). The display unit 210 changes the color of the icon representing the OBW measurement task of the task display section 850 shown in FIG. 2, and notifies the completion of the OBW measurement task (step S250).

When the object of the OBW measurement task is completed, the object of the local communication class for a composite measurement task 762 activates the execute operation of the object of the communication class for communicating with ACP measurement hardware 722 (step S252). In this way, the object of the communication class for communicating with ACP measurement hardware 722 generates the measurement parameter of the measuring unit 160 from the attribute of the object of the ACP measurement parameter class 532 retained by the object of the ACP measurement task class 512 and sets the generated parameter on the measuring unit 160.

Then, the object of the communication class for communicating with ACP measurement hardware 722 measures a ratio of link power of an adjacent channel to a transmission channel by using the measuring unit 160. Then, the object of the communication class for communicating with ACP measurement hardware 722 takes the object of the waveform data as a measurement result of the measurement process from the measuring unit 160, and transfers the object of the waveform data to the object of the ACP measurement task class 512 (step S254). The object of the ACP measurement task class 512 transfers the received object of the waveform data to the display unit 210 through the processing information transferring unit 140 and the process information receiving unit 260 (steps S256 and S258).

The display unit 210 displays the waveform data on the waveform data display section 820 shown in FIG. 2 by giving the object for a base of display to the object of the waveform data and using the operation for displaying the waveform data of the object of the waveform data. Then, when the measurement process is completed, the object of the communication class for communicating with ACP measurement hardware 722 notifies the completion of the measurement process to the objects of the ACP measurement task class 512 and the local communication class for a composite measurement task 762 (step S260), and completes the execute operation. When the notification of completion of the measurement process is received, the object of the ACP measurement task class 512 notifies the completion of the ACP measurement task to the display unit 210 through the processing information transferring unit 140 and the process information receiving unit 260 (step S262).

The display unit 210 changes the color of the icon representing the ACP measurement task of the task display section 850 shown in FIG. 2, and notifies the completion of the ACP measurement task(step S264).

In this way, according to the measurement system described above, since it is not needed to sequentially receive control commands for performing a measurement process from the control host 200, it is possible to perform the measurement process by the measuring unit 160, the GPIB measuring device 300 and the measuring device 400 without delay. Further, since it is possible for a user not to describe directly on the control program about whether or not the measurement process can be performed in parallel, which measuring device is used for a measurement process or how control over the measuring device is performed, it is possible to easily and adequately perform a measurement process without detailed knowledge of the measuring device.

Further, since a description like a method for controlling a measuring device is not described on the control program written by a user, even though the construction of performing control over the measuring device, for example a network to the measuring device, is different, it is possible to share the portion, which should be written by a user, of the control program only if the measurement process performed is the same. Therefore, it is not necessary for a user to write a new control program.

Figure 9:
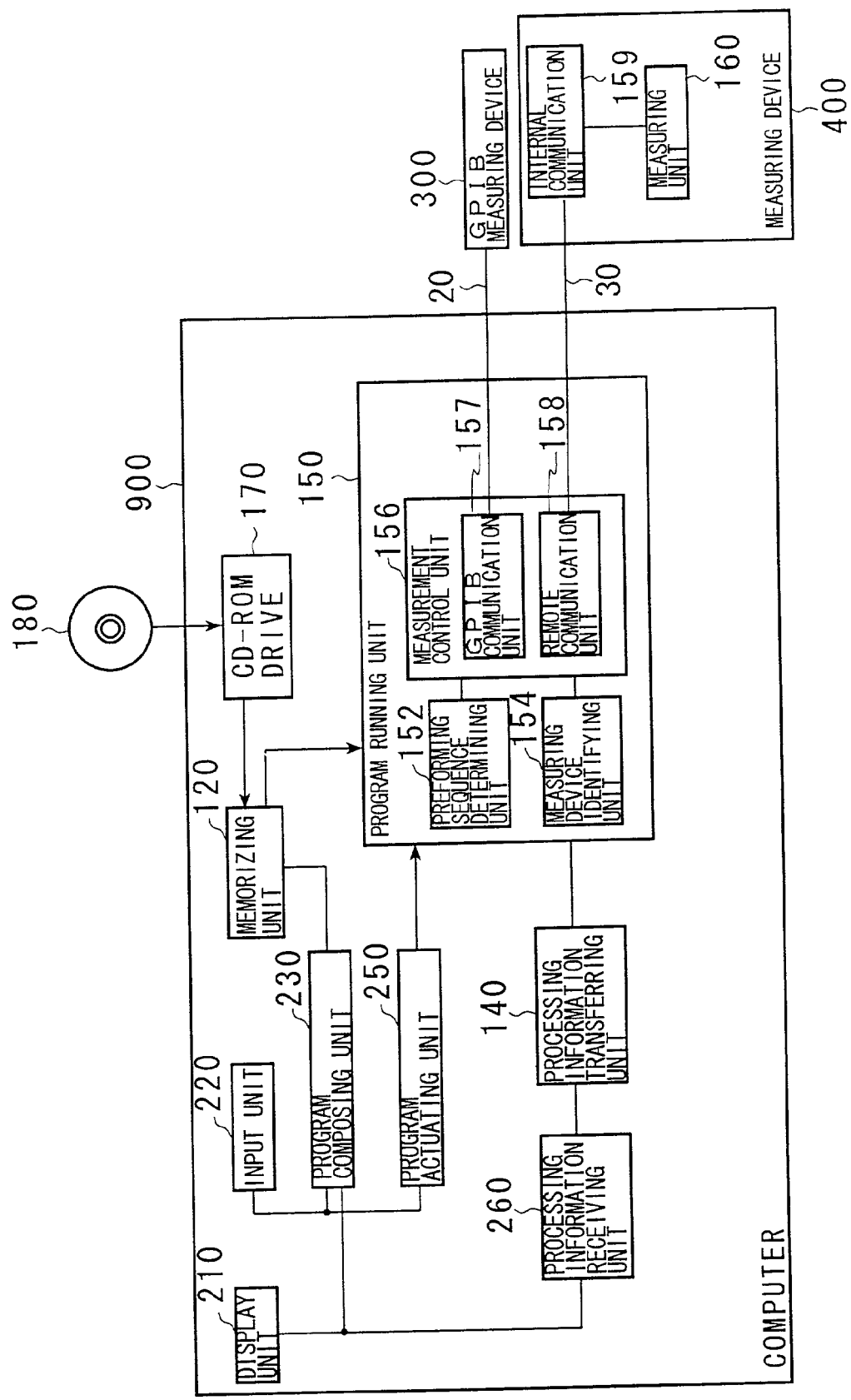
FIG. 9 is a block diagram of a measuring system according to the second embodiment of the present invention.

FIG. 9 is a block diagram of a measuring system according to the second embodiment of the present invention. The same functional elements of the measuring system according to an embodiment of the present invention as shown in FIG. 1 have the same reference numbers and the repeated description is omitted. The measuring system according to the present embodiment includes a measuring device controlling device 900, a GPIB measuring device 300 and a measuring device 400. The measuring device controlling device 900 is coupled to the GPIB measuring device 300 through the GPIB 20. The measuring device controlling device 900 is coupled to the measuring device 400 through the network 30.

The measuring device controlling device 900 includes a display unit 210, a processing information receiving unit 260, an input unit 220, a program composing unit 230, a program actuating unit 250, a memorizing unit 120 as an example of a program memorizing unit, a processing information transferring unit 140, a program running unit 150 and a CD-ROM drive 170. According to the present embodiment, the measuring device controlling device 900 may be a conventional personal computer having an operating system such as Microsoft™ Windows™ 95 and ROM, RAM, CPU, etc. According to the present embodiment, the above units and elements may be embodied by a personal computer running remote applications. The program running unit 150 includes a performing sequence determining unit 152 as an example of a parallel process detecting unit, a measuring device identifying unit 154 as an example of a measuring device detecting unit and a measurement control unit 156.

Figure 10:
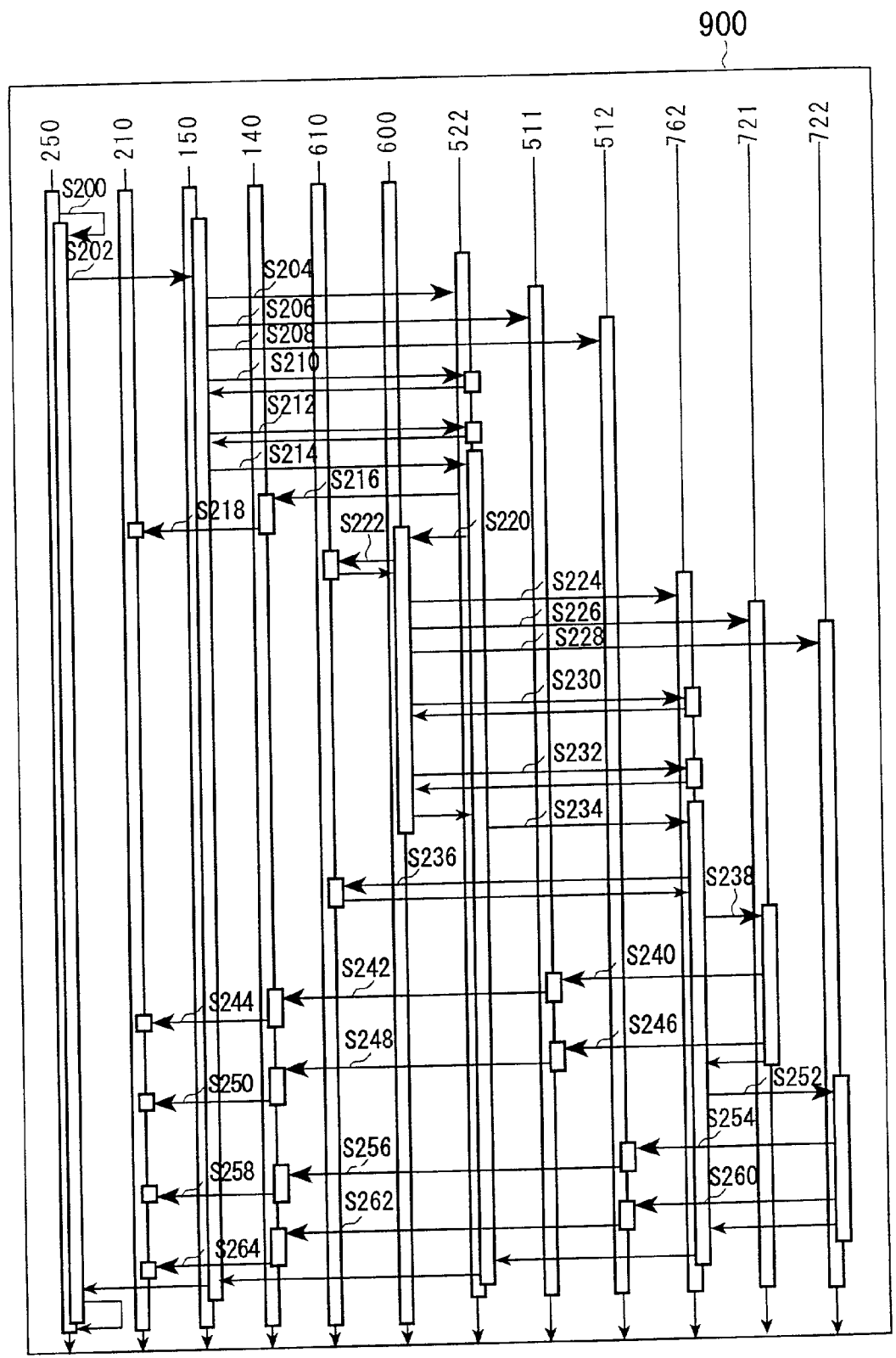
FIG. 10 is a mapping trace diagram showing operations of the measurement system according to the second embodiment of the present invention.

FIG. 10 is a mapping trace diagram showing operations of the measurement system according to the second embodiment of the present invention. In FIG. 8, states and operations of the units or objects of classes are shown while time flows from top to bottom, where a box continued at the bottom of each unit or class represents objects of the units or classes or operations of the objects, big arrows represent activations of operations of objects and small arrows represent returns of the results of the operations of the objects. The same reference number is used for the same operation as in the measuring system shown in FIG. 8.

According to the measuring system of the second embodiment, information is transferred not through a network outside of the device but through an internal network (e.g. bus) of the device in the steps S200, S202, S218, S244, S250, S258 and S264. According to the second embodiment, as for a control program, it is possible for a user not to describe directly on the control program about whether or not the measurement process can be performed in parallel, which measuring device is used for a measurement process or how the control over the measuring device is performed, and it is possible to easily and adequately perform a measurement process without detailed knowledge of the measuring device.

As for a control program which a user writes, since a description like a method for controlling a measuring device is not described, even though the construction of performing control over the measuring device, for example a network to the measuring device, is different, it is possible to share the portion, which should be written by a user, of the control program only if the measurement process performed is the same.

The present invention is not limited to the above described embodiment, but is able to have various kinds of modifications and variations. For example, according to the first embodiment, the control host 200 is formed by a simple computer, but it is possible to form the control host 200 by using a plurality of computers. Further, it is also possible to form the input unit 220, the program composing unit 230, the program transferring unit 240 and the program actuating unit 250 on a first computer, and the processing information receiving unit 260 and the display unit 210 on a second computer.

According to the first embodiment, it is possible to form the display unit for displaying measurement results including numerical data or wave form data by a measurement process, messages, error information, task performing states, etc. on the measuring device 100.

Figure 11:
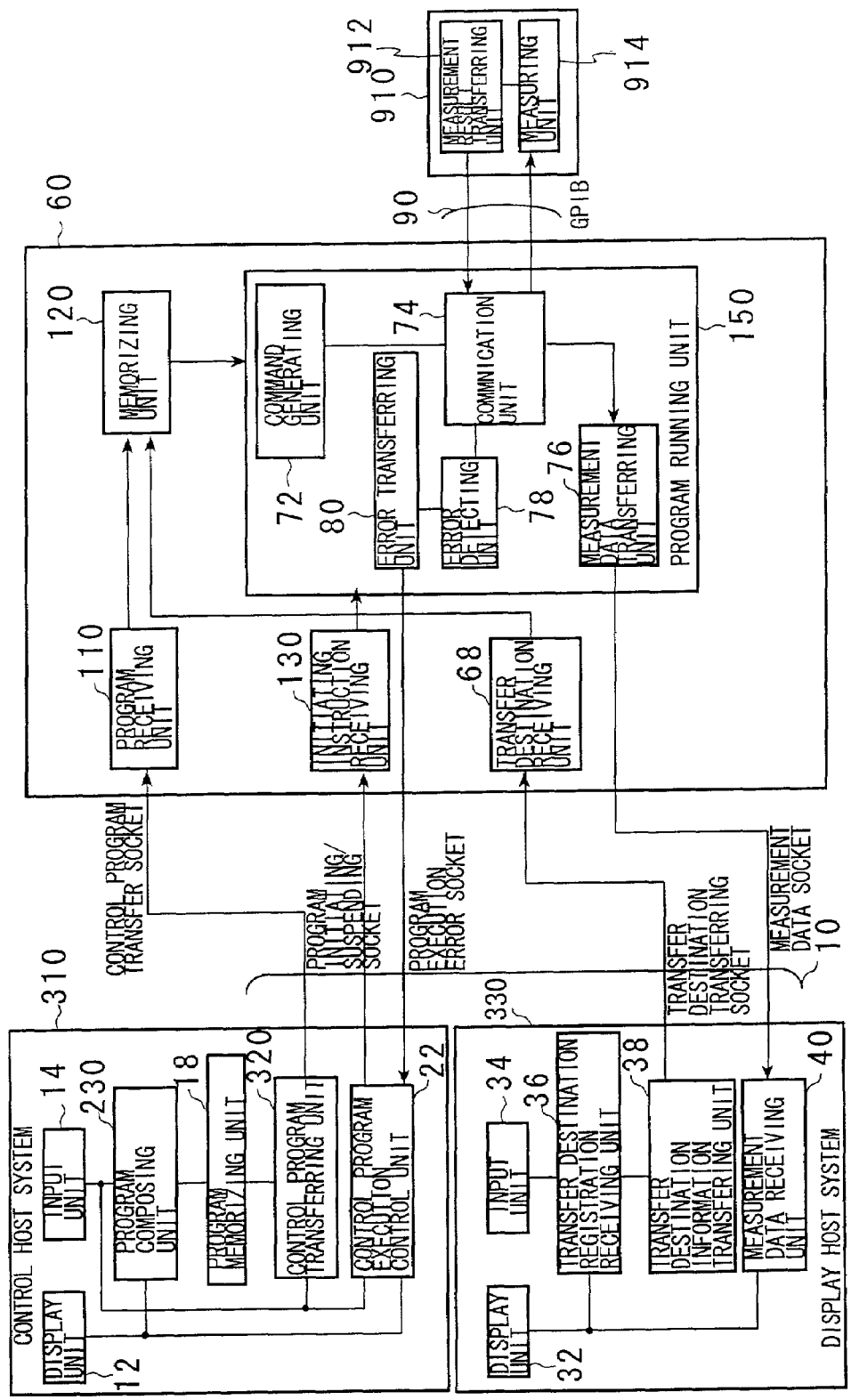
FIG. 11 is a block diagram of a measuring system according to the third embodiment of the present invention.

FIG. 11 is a block diagram of a measuring system according to the third embodiment of the present invention. The measuring system includes a control host system 310, a display host system 330, a measuring device controlling adapter 60 and a measuring device as a measuring unit 910. The control host system 310, the display host system 330 and the measuring device controlling adapter 60 are coupled to one another through Ethernet as an example of network. Further, the measuring device 910 is coupled to the measuring device controlling adapter 60 through the GPIB 90 as an example of a network.

The control host system 310 includes a display unit 12, an input unit 14, a control program composing unit 230, a program memorizing unit 18, a control program transferring unit 320 as an example of a program transferring unit, and a control program execution control unit 22. According to the present embodiment, the control host system 310 maybe a personal computer system having an operating system of Microsoft™ Windows™ 95. According to the present embodiment, the above units and elements may be embodied by a personal computer running applications.

For example, the input unit 14 has input devices such as a mouse and keyboard and receives various input kinds from a user. Further, the input unit 14 receives identification information (e.g. name) of a control program which should be transferred and a sending instruction. Further, the input unit 14 receives identification information (e.g. name) of a control program which should be performed and a program initiating instruction. The input unit 14 receives a program suspending instruction of the executed control program.

The display unit 12 has a display device and displays various kinds of information.

Figure 12:
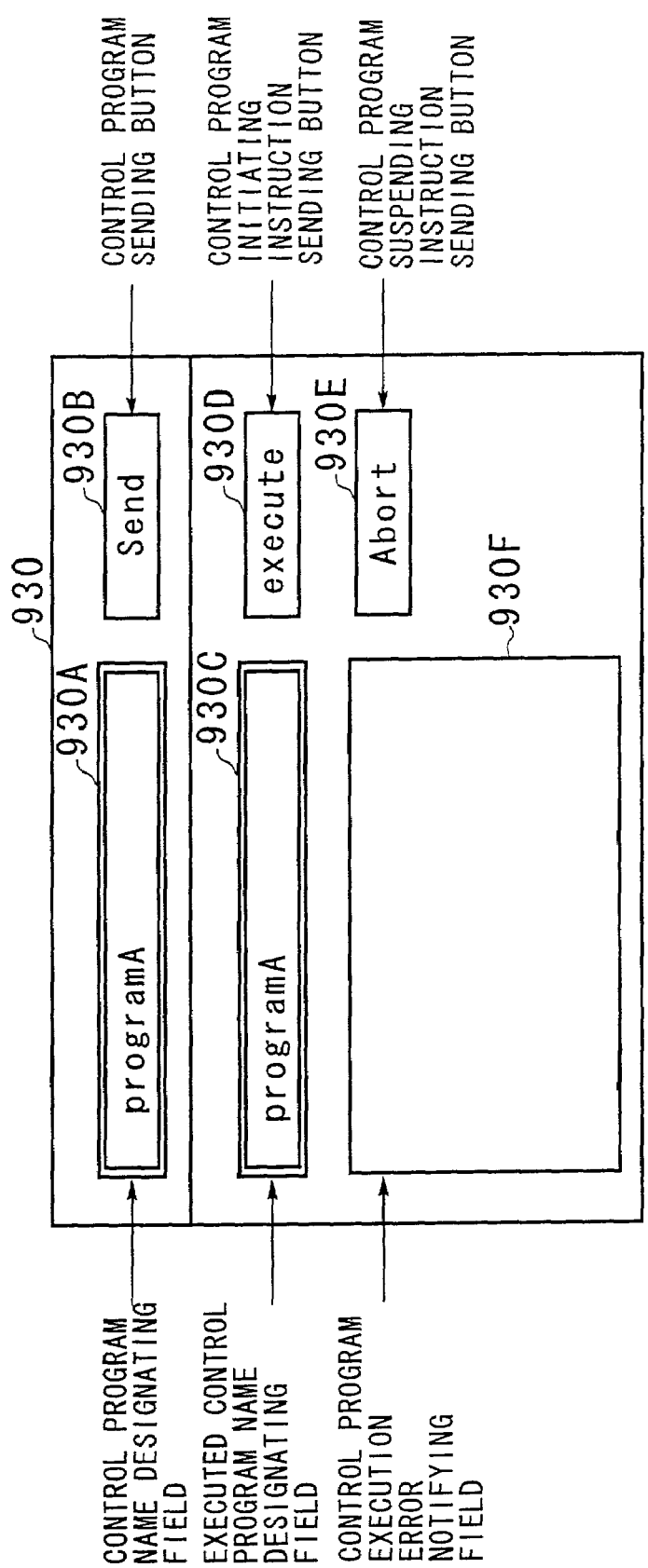
FIG. 12 is a schematic diagram of a display image displayed on the display unit of the control host system according to the third embodiment of the present invention.

FIG. 12 is a schematic diagram of a display image displayed on the display unit of the control host system according to the third embodiment of the present invention. The display image displayed by the display unit 12 of the control host system 310 includes a control program name designating field 930a, a control program sending button 930b, an executed control program name designating field 930c, a control program initiating instruction sending button 930d, a control program suspending instruction sending button 930e and a control program execution error notifying field 930f.

The control program name designating field 930a receives a name input of a control program to be transferred through the input unit 14. The control program sending button 930b receives an instruction for sending a control program. The executed control program name designating field 930c receives a name input of a control program to be executed. The control program initiating instruction sending button 930d receives an instruction for running a control program. The control program suspending instruction sending button 930e receives an instruction for suspending the execution of the control program. The control program execution error notifying field 930f displays information on errors during the execution of the control program.

Referring back to FIG. 11, the control program composing unit 230 lets the display unit 12 display a user interface for describing a control program, and provides a program developing environment where a user can compose and/or edit a program by the user interface through the input unit 14. According to the present embodiment, in order that the control program may be composed in Java language, the control program composing unit 230 is constructed to let a CPU (not shown) run a program providing Java program developing environment of, such as, VisualCafe™ of Symantec™. According to the present embodiment, the control program composing unit 230 converts a control program of text type Java™ language input by the user into an intermediate language, such as Java Byte Code by compiling.

The program memorizing unit 18 memorizes the control program composed by the control program composing unit 230. The control program transferring unit 320 retrieves the composed control program from the program memorizing unit 18, and transfers it to the measuring device controlling adapter 60. According to the present embodiment, the control program transferring unit 320 retrieves the control program input by the input unit 14 from the program memorizing unit 18, and transfers the control program to the program receiving unit 110 by using a socket (control program transferring socket) for transferring the control program through Ethernet 10.

Here, in order to transfer the measuring device control program, it is possible to use other protocols such as FTP (File Transfer Protocol) or HTTP (Hyper Text Transfer Protocol) rather than sockets.

The control program execution control unit 22 transfers the program initiating instruction to the initiating instruction receiving unit 130 based on the input of the program initiating instruction by the input unit 14. According to the present embodiment, the control program execution control unit 22 transfers the name of the control program to be executed to the initiating instruction receiving unit 130 by using a socket (program initiating/suspending socket) for transferring a program initiating or suspending instruction of Ethernet 10. Further, the control program execution control unit 22 receives information relating to errors (error information) from an error transferring unit 80 by using a socket (program execution error socket) for transferring a program execution error of Ethernet 10, and displays the error information on the display unit 12.

The display host system 330 includes an input unit 34, a display unit 32, a transfer destination registration receiving unit 36, a transfer destination information transferring unit 38 and a measurement data receiving unit 40 as an example of a second measurement information receiving unit. According to the present embodiment, the control host system 310 may be a personal computer system having an operating system of Microsoft™ Windows™ 95. The input unit 34 receives various kinds of information from a user. The display unit has a display device and displays various kinds of information.

Figure 13:
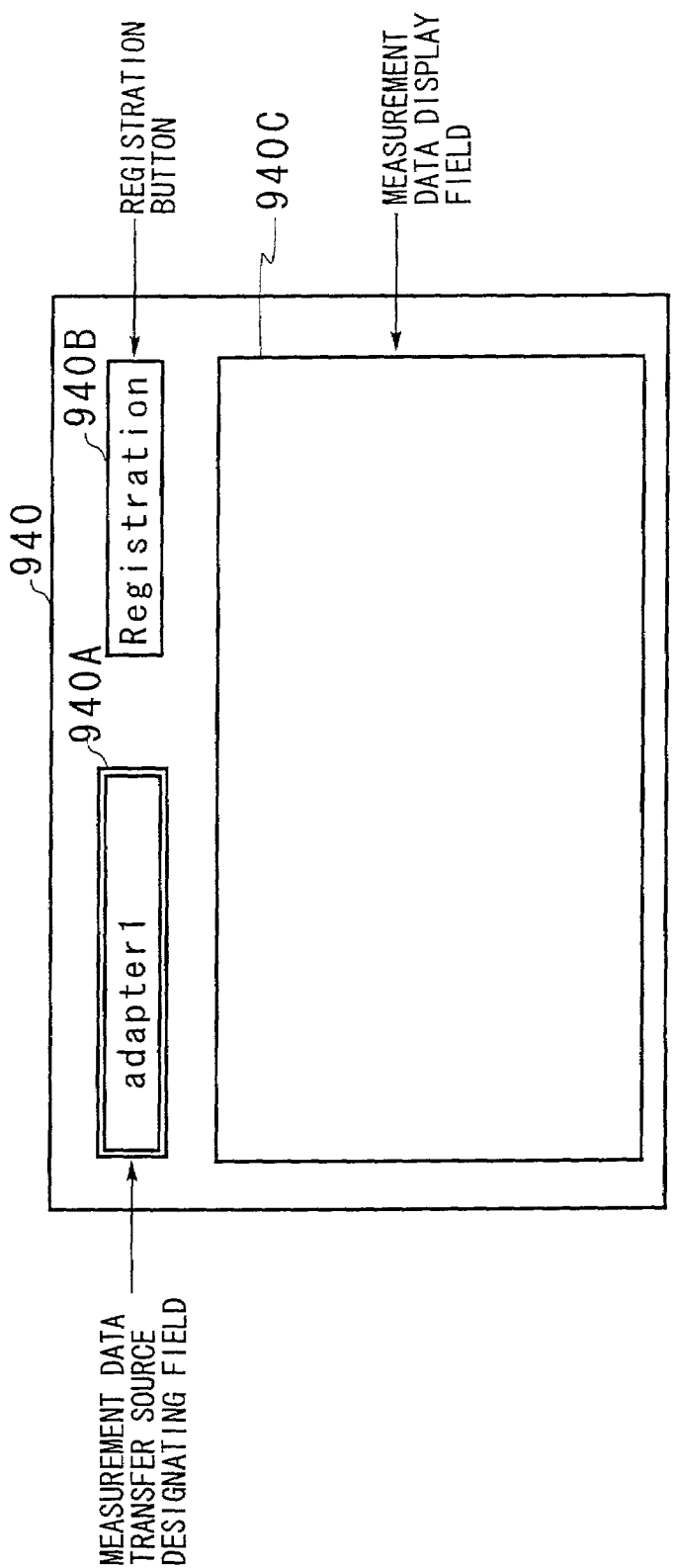
FIG. 13 is a schematic diagram of a display image displayed on the display unit of the display host system according to the third embodiment of the present invention.

FIG. 13 is a schematic diagram of a display image displayed on the display unit of the display host system according to the third embodiment of the present invention. The display image displayed by the display unit 32 of the display host system 330 includes a measurement data transfer source designating field 940a, a registration button 940b and a measurement data display field 940c. A measurement data transfer source designating field 940a receives identification information of the measuring device controlling adapter 60 which transfers the measurement result to the display host system 330. The registration button 940b gives an instruction for registering the identification information of the display host system 330 to the measuring device controlling adapter 60 described in the measurement data transfer source designating field 940a. The measurement data display field 940c displays the measurement result.

Referring back to FIG. 11, the transfer destination registration receiving unit 36 receives identification information of the measuring device controlling adapter 60 which transfers the measurement result by the input unit 34 and the registration instruction. The transfer destination information transferring unit 38 transfers identification information of the display host system 330 to the controlling adapter 60 corresponding to the identification information received by the transfer destination registration receiving unit 36. According to the present embodiment, the transfer destination information transferring unit 38 transfers the identification information by using a socket (transfer destination socket) for transferring identification information of the Ethernet 10.

Here, each of the devices coupled to a network has identification information for identifying the device from one another, for example an Internet Protocol (IP) address. Since this IP address is a set of numbers, it is difficult for a user to handle. Therefore, according to the present embodiment, the transfer destination registration receiving unit 36 receives a name from a string of characters, such as "adapter 1", randomly given to the measuring device controlling adapter 60 on the network as identification information. Then, the transfer destination information transferring unit 38 converts the string of characters into an IP address by the DNS (Domain Name Service) (not shown) coupled to the Ethernet 10, and transfers the IP address of the display host system 330 by using the IP address as a destination.

The measurement data receiving unit 40 receives measurement data from the measuring device controlling adapter 60 through the Ethernet 10 and outputs the measurement data to the display unit 32 for display. According to the present embodiment, the measurement data receiving unit 40 receives the measurement data by using a measurement data socket on the Ethernet 10.

The measuring device controlling adapter 60 includes a program receiving unit 110, a memorizing unit 120 as an example of a transfer destination memorizing unit, an initiating instruction receiving unit 130, a transfer destination receiving unit 68 and a program running unit 150. The program receiving unit 110 receives a control program from the control host system 310 through the Ethernet 10. According to the present embodiment, the program receiving unit 110 receives names of the control program and other programs by using the control program transfer socket on the Ethernet 10. The transfer destination receiving unit 68 receives identification information of the display host system 330, which is a transfer destination of the measurement result, from the display host system 330. According to the present embodiment, the transfer destination receiving unit 68 receives identification information by using the control program transfer socket on the Ethernet 10.

The memorizing unit 120 memorizes the control program received by the program receiving unit 110. According to the present embodiment, the control program received by the program receiving unit 110 is memorized according to the received names. Further, the memorizing unit 120 memorizes identification information of the display host system 330 which is the transfer destination of the measurement result. Here, it is also possible to memorize identification information of a plurality of display host systems 330 which are the transfer destination of the measurement result. Further, the memorizing unit 120 memorizes various kinds of programs called by the control program. According to the present embodiment, command generating software, which generates commands peculiar to the measuring device 910, is memorized as one of the programs called by the control program. This command generating software may be transferred together with the control system from the control host system. Further, the command generating software may also be retrieved from another computer through the Ethernet 10. According to the present embodiment, the command generating software is retrieved by a function referred to as Class Loader of Java Virtual Machine.

The initiating instruction receiving unit 130 receives an instruction for initiating execution of the control program from the control host system 310. According to the present embodiment, the initiating instruction receiving unit 130 receives the name of the control program, which should be executed, by using the program initiating/suspending socket on the Ethernet 10.

The program running unit 150 runs the control program memorized by the memorizing unit 120 when the initiating instruction receiving unit 130 receives the program initiating instruction. According to the present embodiment, the program running unit 150 retrieves and runs the control program corresponding to the names received by the initiating instruction receiving unit 130 from the memorizing unit 120. The program running unit 150 includes a command generating unit 72, a communication unit 74 as an example of a command transferring unit and a measurement result receiving unit, a measurement data transferring unit 76 as an example of a measurement result transferring unit, an error transferring unit 80 as an example of error information transferring unit and an error detecting unit 78. Each of these units is embodied by the running of the control program executed by the program running unit 150. According to the present embodiment, the command generating unit 72 is embodied by the running of the control program executed by the program running unit 150.

The command generating unit 72 generates a control command which lets the measuring device 910 per form the measurement process. The communication unit 74 transfers the control command generated by the command generating unit 72 to the measuring device 910 through GPIB 90. Further, the communication unit 74 receives the measurement result from the measuring device 910 through the GPIB 90.

The measurement data transferring unit 76 transfers the measurement result received by the communication unit 74 to the display host system 330 through the Ethernet 10. According to the present embodiment, the measurement data transferring unit 76 converts the measurement result into data of a predetermined data format, generates a measurement data object having the measurement result converted in a predetermined data format and information for reconverting the converted measurement result into the original one, and transfers the measurement data object.

Further, according to the present embodiment, the measurement data transferring unit 76 transfers the measurement data object by using the measurement data socket of Ethernet 10.

The error detecting unit 78 detects errors during the execution of the control program. Errors to be detected may include, for example, a transfer failure of control command to the measuring device 910 from the measuring device controlling adapter 60. The error transferring unit 80 transfers error information to the control host system 310 through the Ethernet 10 in case the error detecting unit 78 detected an error. According to the present embodiment, the error transferring unit 80 transfers error information by using the program execution error socket of the Ethernet 10.

The measuring device 910 includes a measuring unit 914, which performs a predetermined measurement process according to the control command transferred from the measuring device controlling adapter 60 through the GPIB 90, and a measurement result transferring unit 912 which transfers the measurement result to the measuring device controlling adapter 60 through the GPIB 90. According to the present embodiment, the measuring device 910 is a spectrum analyzer which performs a measurement process for Occupied Bandwidth ("OBW") and Adjacent Channel Leakage Power ("ACP") of a cellular phone system.

Figure 14:
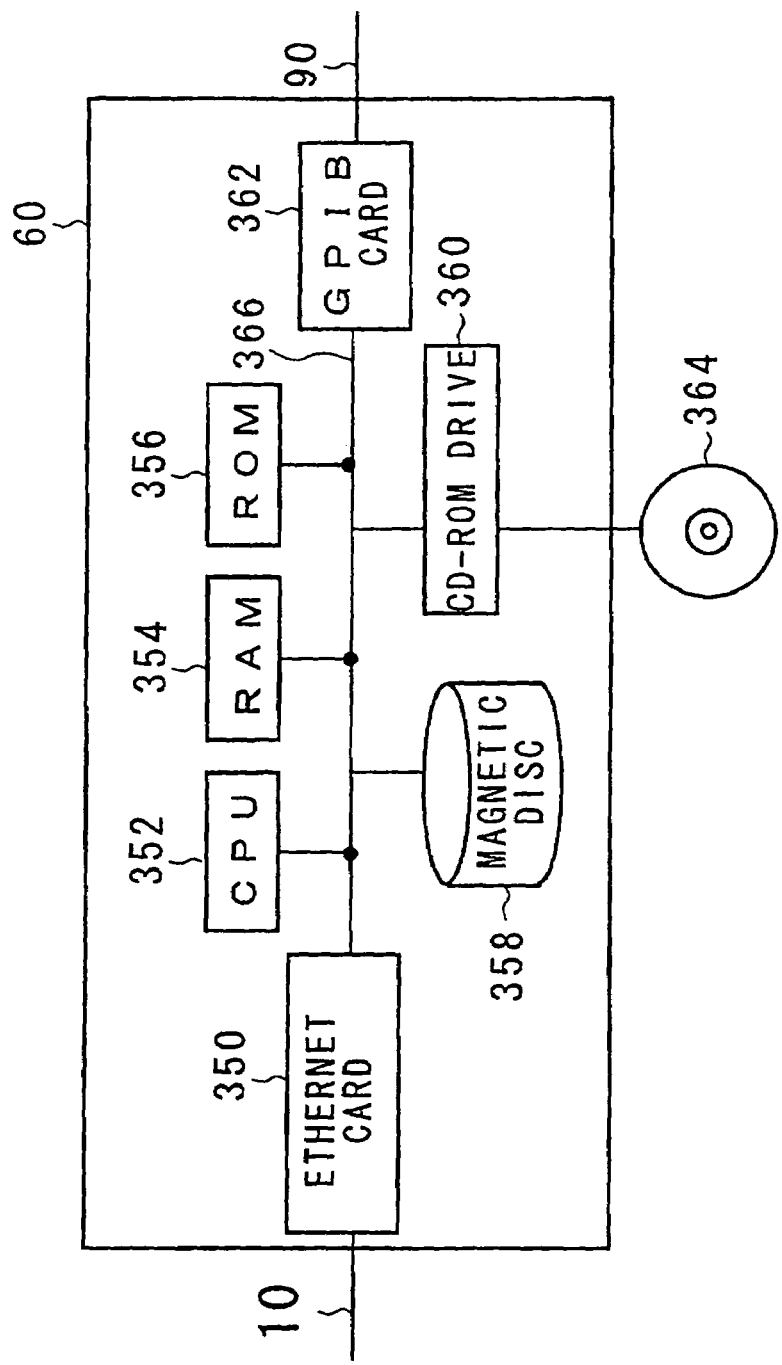
FIG. 14 is a block diagram of a hardware structure of the measuring device controlling adapter according to the third embodiment of the present invention.

FIG. 14 is a block diagram of a hardware structure of the measuring device controlling adapter according to the third embodiment of the present invention. The measuring device controlling adapter 60 includes an Ethernet card 350, a CPU (Central Processing Unit) 352, a RAM (Random Access Memory) 354, a ROM (Read Only Memory) 356, a magnetic disc 358, a CD-ROM drive 360 and a GPIB card 362. The Ethernet card 350, the CPU 352, the RAM 354, the ROM 356, the magnetic disc 358, the CD-ROM drive 360 and the GPIB card 362 are coupled to one another through a bus 366. The Ethernet card 350 relays data communication between the Ethernet 10 and the bus 366. The GPIB card 362 relays data communication between the GPIB 90 and the bus 366.

The program running unit 150 retrieves a predetermined program stored in the magnetic disc 358 into the RAM 354 and provides it to the CPU 352 for running it. According to the present embodiment, the program running unit 150 is formed by a JVM (Java Virtual Machine) capable of running Java Byte Code. The program receiving unit 110, the initiating instruction receiving unit 130, the transfer destination receiving unit 68 and the memorizing unit 120 are embodied by the above described hardware cooperatively working with a predetermined program which is stored in the magnetic disc 358, retrieved into the RAM 354, and executed by the CPU.

According to the present embodiment, a program for forming the program running unit 150, a program receiving module for forming the program receiving unit 110, an initiating instruction receiving module for forming the initiating instruction receiving module 130, a transfer destination receiving module for forming the transfer destination receiving unit 68 and a memorizing module for forming the memorizing unit 120 are recorded on the CD-ROM 364 as an example of a recording media, retrieved by the CD-ROM drive 360 and installed on the magnetic disc 358. Here, the recording media may include an optical recording media such as DVD (Digital Video Disc), a magnetic recording media such as an MO (Magneto-Optical) disc and magnetic recording media such as a floppy disc.

FIG. 15 is an example of a control program of the measuring system according to the third embodiment of the present invention. According to the present embodiment, the control program is described in Java language. In the control program, an instruction for generating an OBW measurement object is described in part P1. The OBW measurement object has data and a method relating to the OBW measurement process. In part P2, an instruction for generating an ACP measurement object is described. The ACP measurement object has data and a method relating to the ACP measurement process. In part P3, an instruction is described for generating a measurement data transfer object. The measurement data transfer object has data and a method relating to the transfer of the measurement result. In part P4, an instruction is described for setting values of data used by each of the objects.

In part P5 and below, processes to be performed are described. In part P6, an instruction is described for performing a transport method of the measurement data transferring object, which transfers the measurement data object having a measurement result by the OBW measurement process and an instruction for performing a transport method of the measurement data transferring object, which transfers the measurement data object having a measurement result by the ACP measurement process.

Figure 16:
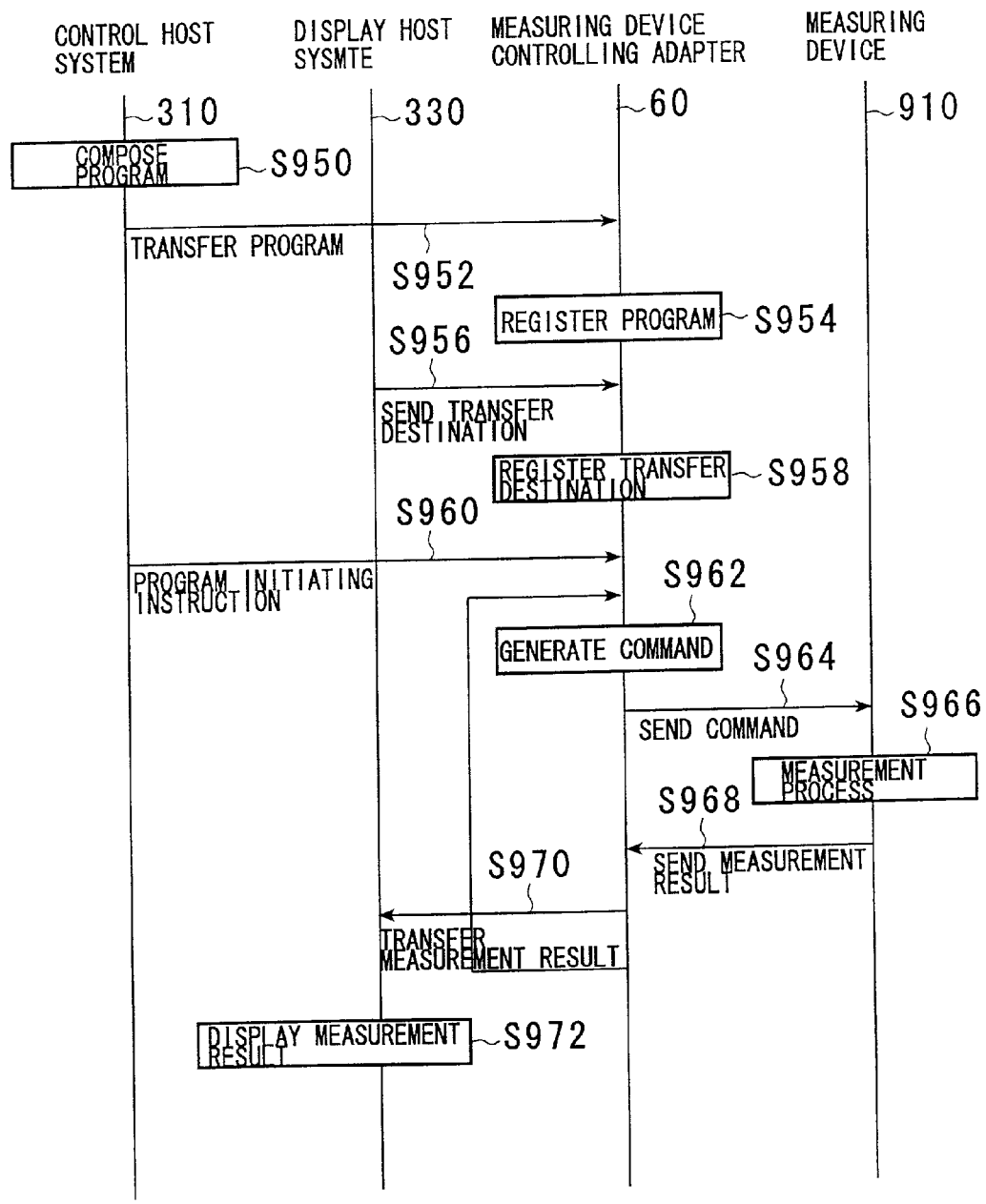
FIG. 16 is an operation sequence of the measuring system according to the third embodiment of the present invention.

FIG. 16 is an operation sequence of the measuring system according to the third embodiment of the present invention. In the control host system of the measuring system, the control program composing unit 230 composes a control program based on a user input by the input unit 14, and the program memorizing unit 18 memorizes the composed control program(step S950). Then, when a name of the control program and a transferring instruction are input by the user through the input unit 14, the control program transferring unit 320 transfers the corresponding control program to the program receiving unit 110 of the measuring device controlling adapter 60 through the Ethernet 10 (step S952). In the measuring device controlling adapter 60, which received the control program, the memorizing unit 120 memorizes the control program received by the program receiving unit 110 (step S954).

On the other hand, in the display host system 330, the transfer destination registration receiving unit 36 receives identification information of the measuring device controlling adapter 60, which transfers the measurement result, by the user through the input unit 34 and transfers identification information of the display host system to the measuring device controlling adapter 60 corresponding to the identification information received by the transfer destination information transferring unit 38 through the Ethernet 10 (step S956). In the measuring device controlling adapter 60, the transfer destination receiving unit 68 receives identification information of the display host system 330 through the Ethernet 10 and registers the identification information as a transfer destination of the measurement data in the memorizing unit 120 (step S958).

Then, in the control host system 310, when a name of an executed program and a running instruction are input by a user through the input unit 14, the control program execution control unit 22 transfers the name of the program as a program initiating instruction to the measuring device controlling adapter 60 through the Ethernet 10 (step S960). In the measuring device controlling adapter 60, the initiating instruction receiving unit 130 receives the name of the program through the Ethernet 10 and notifies it to the program running unit 150. The program running unit 150 retrieves the notified control program from the memorizing unit 120 and runs the control program.

In this way, the command generating unit 72 generates control commands (S962) based on the control program, and the communication unit 74 sends the generated control commands to the measuring device 910 through the GPIB 90 (step S964). In the measuring device 910, the measuring unit 914 performs the measurement process according to the control command (step S966), and the measurement result transferring unit 912 transfers the measurement result to the measuring device controlling adapter 60 through the GPIB 90 (step S968). In the measuring device controlling adapter 60, the communication unit 74 receives the measurement result through the GPIB 90, and the measurement data transferring unit 76 converts the measurement result into the measurement data object. Then, the measurement data transferring unit 76 transfers the measurement data object to the display host system 60 registered in the memorizing unit 120 through the Ethernet 10 (step S970).

Further, in case there is more control commands which should be generated, the above described steps from S962 to S970 are repeated. While the steps are performed, the error detecting unit 78 may detect errors, and, in this case, the error transferring unit 80 transfers the error information to the control host system 30 through the Ethernet 10. In this case, in the control host system 310, the control program execution control unit 22 receives the error information and displays the error information on the display unit 12.

In the display host system 330, the measurement data receiving unit 40 receives the measurement data object, retrieves the measurement result from the measurement data object and displays the measurement result on the display unit 32(step S972).

As described above, according to the third embodiment, since a control command can be transferred to the measuring device 910 without using the Ethernet 10, it is possible to adequately transfer the control command to the measuring device 910. Further, it is possible to control the measuring device by the control host system coupled to the Ethernet and display the measurement result on the display host system coupled to the Ethernet, where the measuring device was conventionally coupled only to the GPIB.

Figure 17:
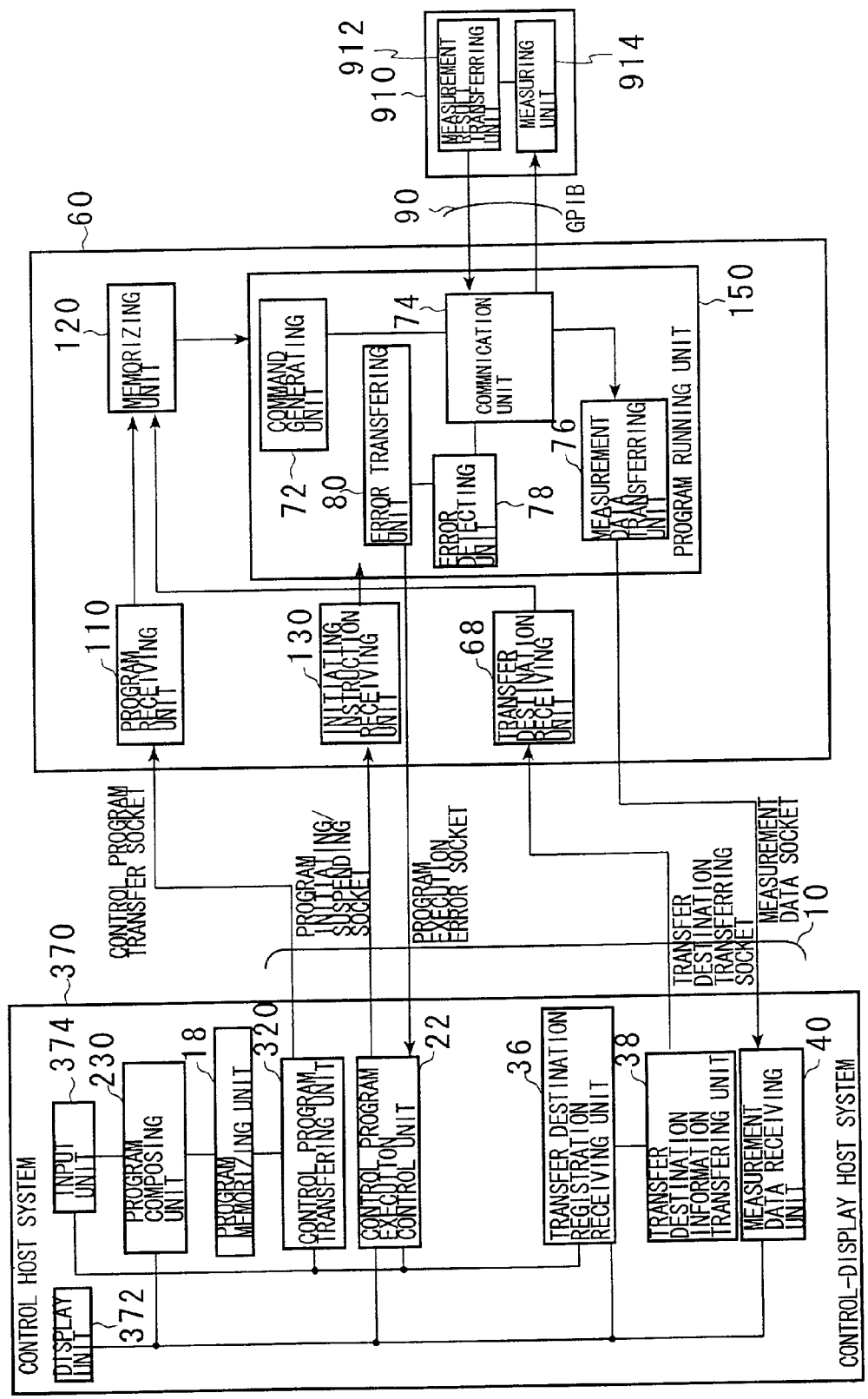
FIG. 17 is a block diagram of a measuring system according to the fourth embodiment of the present invention.

FIG. 17 is a block diagram of a measuring system according to the fourth embodiment of the present invention. The measuring system shown in FIG. 17 includes a control-display host system formed by integrating the control host system and the display host system of the measuring system according to the third embodiment shown in FIG. 11. The same reference number is used for the same functional units as in the measuring system shown in FIG. 11 and repeated description is omitted. According to the present embodiment, the control-display host system 370 may be a personal computer system having an operating system of Microsoft™ Windows™ 95. A display unit 372 has functions of the display units 12 and 32 of the control host system 310 and the display host system 330 shown in FIG. 11. An input unit 374 has functions of the input units 14 and 34 of the control host system 310 and the display host system 330 shown in FIG. 11.

Figure 18:
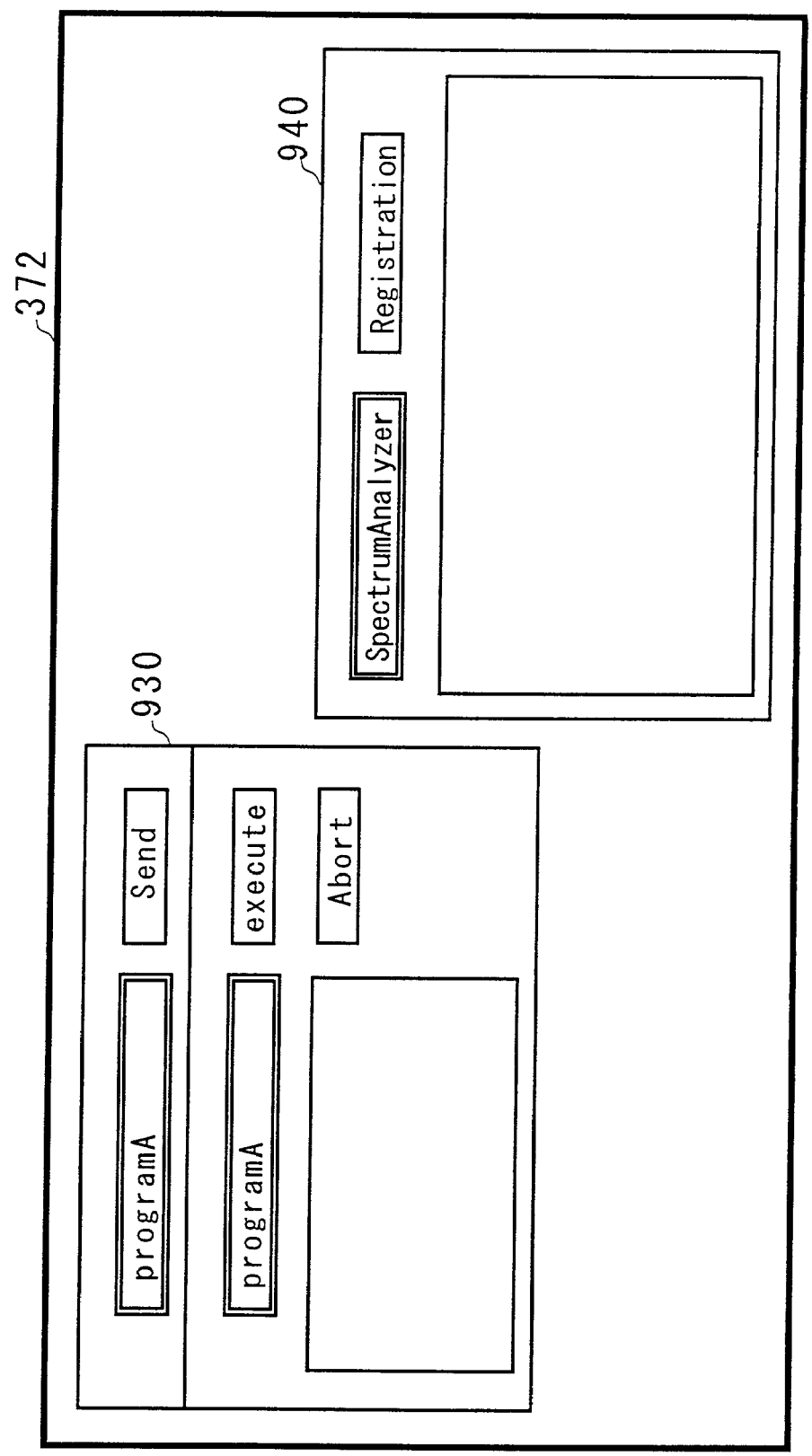
FIG. 18 is a schematic diagram of a display image displayed on the display unit of the control-display host system according to the fourth embodiment of the present invention.

FIG. 18 is a schematic diagram of a display image displayed on the display unit of the control-display host system according to the fourth embodiment of the present invention. The same reference number is used for the same functional units as shown in FIGS. 12 and 13 and repeated description is omitted. The display unit 372 displays the display images 930 and 940 respectively displayed by the display units 12 and 32 according to the third embodiment as an integrated display image 372.

The present invention is not limited to the above described embodiments, but is able to have various kinds of modifications and variations. For example, even though according to the above embodiments, the control host system 310 and the display host system 330 or the control-display host system 370 are coupled to the measuring device controlling adapter 60 through the Ethernet 10, the present invention is not limited to this configuration but other networks may be used. Further, even though according to the above embodiments, a spectrum analyzer is used as the measuring device 910, the present invention is not limited to this configuration, but, for example, an oscilloscope, a distortion meter, a power meter, a semiconductor tester, etc. may be used. To sum up, a passive or an active device type, which is required for performing assessment, test, repair, adjustment, etc., may be used.

Although the present invention has been described by way of exemplary embodiments, it should be understood that many changes and substitutions may be made by those skilled in the art without departing from the spirit and the scope of the present invention which is defined only by the appended claims.

What is claimed is:

1. A measuring device controlling adapter coupled to a first network and to a measuring unit for performing a measurement process comprising:
 a program receiving unit for receiving a control program for performing said measurement process from said first network;
 a memorizing unit for memorizing said control program;
 an initiating instruction receiving unit for receiving a program initiating instruction of said measurement process by the measuring unit through said first network; and
 a measurement control unit for letting said measuring unit perform said measurement process based on said control program memorized by said memorizing unit in case said initiating instruction receiving unit receives said program initiating instruction,
 wherein said measurement control unit includes command generating unit for generating a control command which operates the measuring unit to perform the measurement process, a communication unit for transferring the control command generated by the command generating unit to the measuring unit through GPIB and for receiving a measurement result from the measuring unit through the GPIB, and a measurement data transferring unit for transferring the measurement result received by the communication unit to a display host system though the Ethernet.

2. A measuring device controlling adapter claimed in claim 1, wherein said measuring device controlling adapter is coupled to a second network; and said measurement control unit comprises,
 a command generating unit for generating a control command which controls said measuring unit;
 a command transferring unit for transferring said control command to said measuring unit through said second network; and
 a measurement result receiving unit for receiving a measurement result of said measurement process from said measuring unit.

3. A measuring device controlling adapter claimed in claim 2, wherein said second network is GPIB.

4. A measuring device controlling adapter claimed in claim 2 further comprising:
 a program running unit capable of executing a program described in Java™ language,
 wherein said control program is described in Java language, and
 at least one of said command generating unit and said command transferring unit is embodied by said program running unit which executes said control program.

5. A measuring device controlling adapter claimed in claim 1 further comprising:
 a measurement result transferring unit for transferring said measurement result through said first network.

6. A measuring device controlling adapter claimed in claim 5 further comprising:
 a transfer destination memorizing unit for memorizing identification information of a transfer destination of said measurement result,
 wherein said measurement result transferring unit transfers said measurement result to said transfer destination based on said identification information.

7. A measuring device controlling adapter claimed in claim 6 further comprising:
 a transfer destination receiving unit for receiving said identification information of said transfer destination of said measurement result through said first network; and
 a transfer destination registration unit for storing said received identification information of said transfer destination in said transfer destination memorizing unit.

8. A measuring device controlling adapter claimed in claim 1 further comprising:
 an error detecting unit for detecting a predetermined error during said measurement process; and
 an error information transferring unit for transferring information relating to said error through said first network.

9. A measuring device controlling adapter claimed in claim 1, wherein said first network is Ethernet.

10. A measuring device controlling adapter claimed in claim 1, wherein
 said program receiving unit receives at least a portion of each of a plurality of said control programs,
 said memorizing unit memorizes a plurality of said control programs, and
 said command generating unit selects said control program being performed from said memorizing unit based on said program initiating instruction and generates said control command based on said control program.

11. A measuring device controlling adapter claimed in claim 1, wherein said measurement result transferring unit converts said measurement result into data of a predetermined format, and transfers an object having said measurement result converted in said predetermined data format and information for reconverting said converted measurement result into original one to said second network.

12. A measuring device comprising a measuring device controlling adapter claimed in claim 1 and said measuring unit for performing said measurement process.

13. A measuring device claimed in claim 12, wherein said initiating instruction receiving unit receives a program initiating instruction of said control program from said first network.

14. A measuring device claimed in claim 12 further comprising:
a processing information transferring unit for transferring information relating to said measurement process through said first network.

15. A measuring device claimed in 12, wherein
said measuring device is coupled to a third network,
said control program further comprises contents relating to another measurement process performed by another measuring device coupled to said third network, and
said measurement control unit further lets said other measuring device perform said other measurement process based on said control program.

16. A measuring device claimed in claim 15 further comprising:
a measuring device information memorizing unit for relationally memorizing at least two (2) kinds of information respectively identifying said measurement process and said measuring device which performs said measurement process; and
a measuring device identifying unit for identifying said measuring device which performs said measurement process of said control program based on information of said measuring device information memorizing unit,
wherein said measurement control unit lets said identified measuring device perform said measurement process.

17. A measuring device claimed in claim 12, wherein said control program comprises contents prescribing a plurality of measurement processes,
further comprising a performing sequence determining unit for determining a sequence for performing said plurality of measurement processes based on said control program,
wherein said measurement control unit lets said plurality of measurement processes be performed according to said sequence.

18. A measuring device claimed in one of claim 12 further comprising:
a measurement process information memorizing unit for memorizing measurement process information which identifies said measurement process which can be performed in parallel,
wherein said measurement control unit lets said measurement process, which can be performed in parallel, be performed in parallel based on said measurement process information.

19. A measuring system comprising:
a measuring device, which comprises a measuring unit for performing a measurement process; and
a control host, which controls said measurement process by said measuring device through a first network,
wherein said control host comprises:
a program transferring unit for transferring a control program to said measuring device; and
an initiating instruction transferring unit for transferring a program initiating instruction of measurement process of said measuring device, and
said measuring device comprises:
a program receiving unit for receiving said control program from said first network;
a memorizing unit for memorizing said control program;
an initiating instruction receiving unit for receiving a program initiating instruction of said measurement process; and
a measurement control unit for controlling said measuring device based on said control program memorized by said memorizing unit in case said initiating instruction receiving unit receives said program initiating instruction,
wherein said measurement control unit includes command generating unit for generating a control command which operates the measuring device to perform the measurement process, a communication unit for transferring the control command generated by the command generating unit to the measuring device through GPIB and for receiving a measurement result from the measuring device through the GPIB, and a measurement data transferring unit for transferring the measurement result received by the communication unit to a display host system though the Ethernet.

20. A measuring system claimed in claim 19, wherein said measuring device is coupled to said control host through said first network, further comprising a measuring device controlling adapter coupled to said measuring unit through a second network,
wherein said measuring device controlling adapter comprises:
a program receiving unit for receiving a control program for controlling said measuring device from said first network;
a memorizing unit for memorizing said control program;
an initiating instruction receiving unit for receiving a program initiating instruction of said measurement process by said measuring unit through said first network; and
a command generating unit for generating a control command based on said control program memorized by said memorizing unit in case said program initiating instruction is received;
a command transferring unit for transferring said control command to said measuring device through said second network based on said control program memorized by said memorizing unit; and
a measurement result receiving unit for receiving a measurement result of said measurement process from said measuring device, and
said measuring unit comprises:
a measuring unit for performing a measurement process based on said transferred control command; and
a measurement result transferring unit for transferring a measurement result of said measurement process to said measuring device controlling adapter.

21. A measuring system claimed in claim 20 further comprising:
a display host for displaying a result of said measurement process by said measuring device, said display host being coupled to said measuring device controlling adapter through said first network, wherein said measuring device controlling adapter comprises a measurement result transferring unit for transferring said measurement result through said first network, and said display host comprises:
   a second measurement result receiving unit for receiving said measurement result transferred from said measurement result transferring unit; and
   a display unit for displaying said measurement result.

22. A measuring system claimed in claim 21, wherein said measuring device controlling adapter further comprises:
   a transfer destination memorizing unit for memorizing identification information of said display host which is a transfer destination of said measurement result;
   a transfer destination receiving unit for receiving said identification information of said display host which is a transfer destination of said measurement result through said first network; and
   a transfer destination registration unit for memorizing said received identification information in said transfer destination memorizing unit, and
said measurement result transferring unit transfers said measurement result to said display host of said transfer destination based on said identification information, and said display host further comprises:
   a transfer destination information transferring unit for transferring said identification information of said display host to said measuring device controlling adapter through said first network.

23. A measuring system claimed in claim 20 wherein said measuring device controlling adapter further comprises:
   an error detecting unit for detecting a predetermined error during said measurement process; and
   an error information transferring unit for transferring information relating to said error to said control host through said first network, and
said control host further comprises:
   an error information receiving unit for receiving information relating to transferred error through said first network; and
   an error display unit for displaying said received information relating to error.

24. A measuring system claimed in claim 19, wherein said control host further comprising an initiating instruction transferring unit for transferring a program initiating instruction of said control program, and
said initiating instruction transferring unit receives said program initiating instruction through said first network.

25. A measuring system claimed in claim 24, wherein said measuring device further comprises a processing information transferring unit for transferring processing information relating to said measurement process to said control host through said first network, and
said control host further comprises;
   a processing information receiving unit for receiving said processing information transferred from said processing information transferring unit; and
   a display unit for displaying said processing information.

26. A measuring system claimed in claim 24, wherein said measuring device is further coupled to another network,
said control program further comprises contents relating to another measurement process performed by another measuring device coupled to said other network, and said measurement control unit further controls another measurement process by said other measuring device based on said control program.

27. A measuring system claimed in claim 26, further comprising:
   a measuring device information memorizing unit for relationally memorizing at least two (2) kinds of information respectively identifying said measurement process and said measuring device which performs said measurement process; and
   a measuring device identifying unit for identifying said measuring device which performs said measurement process of said control program based on information of said measuring device information memorizing unit,
wherein said measurement control unit lets said identified measuring device perform said measurement process.

28. A measuring system claimed claim 24,
wherein said control program comprises contents prescribing a plurality of said measurement processes,
further comprising a performing sequence determining unit for determining a sequence for performing said plurality of measurement processes based on said control program, wherein said measurement control unit lets said plurality of measurement processes be performed according to said sequence.

29. A measuring system claimed in claim 24 further comprising:
   a measurement process information memorizing unit for memorizing measurement process information which identifies said measurement process which can be performed in parallel,
wherein said measurement control unit lets said measurement process, which can be performed in parallel, be performed in parallel based on said measurement process information.

30. A measuring device controller coupled to a network for controlling a measuring device performing a measurement process comprising:
   a program memorizing unit for memorizing a control program which comprises contents prescribing said measurement process;
   a measuring device detecting unit for detecting said measuring device which performs said measurement process based on said control program; and
   a measurement control unit for letting said detected measuring device perform said measurement process based on said control program through said network,
wherein said measurement control unit includes command generating unit for generating a control command which operates the measuring device to perform the measurement process, a communication unit for transferring the control command generated by the command generating unit to the measuring device through GPIB and for receiving a measurement result from the measuring device through the GPIB, and a measurement data transferring unit for transferring the measurement result received by the communication unit to a display host system though the Ethernet.

31. A measuring device controller coupled to a network for controlling a measuring device performing a measurement process comprising:
   a program memorizing unit for memorizing a control program which comprises contents prescribing said measurement process;

a parallel process detecting unit for detecting a plurality of measurement processes which can be performed in parallel from said measurement processes based on said control program; and a measurement control unit for letting said measuring device perform said plurality of measurement processes detected by said parallel process detecting unit in parallel, wherein said measurement control unit includes command generating unit for generating a control command which operates the measuring device to perform the measurement process, a communication unit for transferring the control command generated by the command generating unit to the measuring device through GPIB and for receiving a measurement result from the measuring device through the GPIB, and a measurement data transferring unit for transferring the measurement result received by the communication unit to a display host system though the Ethernet.

32. A measurement process performing method for letting a measuring device coupled through a network perform a measurement process, wherein said measuring device has a measuring unit for performing said measurement process, comprising:

a program receiving step for receiving a control program for controlling said measuring unit through said network;

an initiating instruction receiving step for receiving a program initiating instruction of said control program; and a control step for controlling said measurement process by said measuring unit based on said control program in case said program initiating instruction is received, wherein said control step includes command generating step for generating a control command which operates the measuring device to perform the measurement process, a communicating step for transferring the control command generated by the command generating step to the measuring device through GPIB and for receiving a measurement result from the measuring device through the GPIB, and a measurement data transferring step for transferring the measurement result received by the communicating step to a display host system though the Ethernet.

33. A measurement process performing method claimed in claim 32, wherein said control step comprises:

a command generating step for generating a control command based on said control program;

a measuring command transferring step for transferring said generated control command to said measuring device;

a measurement result receiving step for receiving a measurement result; and a measurement result transferring unit for transferring said measurement result through said first network.

34. A recording medium on which a program for letting a measuring device coupled through a network perform a measurement process, wherein said measuring device has a measuring unit for performing said measurement process, is recorded comprising:

a program receiving module for activating reception of a control program, which comprises contents relating to said measurement process, from said network;

a memorizing module for storing said control program;

an initiating instruction receiving module for activating reception of a program initiating instruction of said control program; and a measurement control unit for letting said measuring unit perform said measurement process based on said control program memorized by said memorizing unit in case said initiating instruction receiving unit receives said program initiating instruction, wherein said measurement control unit includes command generating unit for generating a control command which operates the measuring device to perform the measurement process, a communication unit for transferring the control command generated by the command generating unit to the measuring device through GPIB and for receiving a measurement result from the measuring device through the GPIB, and a measurement data transferring unit for transferring the measurement result received by the communication unit to a display host system though the Ethernet.

35. A program for letting a measuring device coupled through a network perform a measurement process, wherein said measuring device has a measuring unit for performing said measurement process, is recorded comprising:

a program receiving module for activating reception of a control program, which comprises contents relating to said measurement process, from said network;

a memorizing module for storing said control program;

an initiating instruction receiving module for activating reception of a program initiating instruction of said control program; and a measurement control unit for letting said measuring unit perform said measurement process based on said control program memorized by said memorizing unit in case said initiating instruction receiving unit receives said program initiating instruction, wherein said measurement control unit includes command generating unit for generating a control command which operates the measuring device to perform the measurement process, a communication unit for transferring the control command generated by the command generating unit to the measuring device through GPIB and for receiving a measurement result from the measuring device through the GPIB, and a measurement data transferring unit for transferring the measurement result received by the communication unit to a display host system though the Ethernet.

* * * * *